United States Patent
Hayashi et al.

(10) Patent No.: US 8,619,486 B2
(45) Date of Patent: Dec. 31, 2013

(54) SEMICONDUCTOR MEMORY DEVICE INCORPORATING AN INTERFACE CHIP FOR SELECTIVELY REFRESHING MEMORY CELLS IN CORE CHIPS

(75) Inventors: Junichi Hayashi, Tokyo (JP); Akira Ide, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 356 days.

(21) Appl. No.: 13/160,198

(22) Filed: Jun. 14, 2011

(65) Prior Publication Data

US 2011/0305057 A1  Dec. 15, 2011

(30) Foreign Application Priority Data

Jun. 15, 2010  (JP) ................................. 2010-135822

(51) Int. Cl.
*G11C 7/00* (2006.01)
(52) U.S. Cl.
USPC . 365/222; 365/230.03; 365/236; 365/233.13; 365/51; 365/63
(58) Field of Classification Search
USPC .................. 365/51, 72, 63, 222, 230.03, 236, 365/233.13, 233.1
See application file for complete search history.

(56) References Cited

U.S. PATENT DOCUMENTS

| 8,076,764 B2* | 12/2011 | Yamada et al. | 257/686 |
| 2007/0126105 A1 | 6/2007 | Yamada et al. | |
| 2011/0087835 A1* | 4/2011 | Sato et al. | 711/106 |

FOREIGN PATENT DOCUMENTS

| JP | 2000-30439 A | 1/2000 |
| JP | 2007-157266 A | 6/2007 |

* cited by examiner

*Primary Examiner* — Andrew Q Tran
(74) *Attorney, Agent, or Firm* — Sughrue Mion, PLLC

(57) ABSTRACT

In one embodiment, a semiconductor memory device receives a refresh command and address information, and supplies a refresh control signal and the address information in common to core chips. Each of the core chips includes a layer-address comparison circuit that determines whether the address information assigns an own core chip, and a refresh control circuit that refreshes an own memory cell based on the refresh control signal when the address information assigns the own core chip. With this arrangement, a memory capacity of a chip that is refreshed by a refresh command for one time is reduced, and therefore a shortest issuing interval of a refresh command can be shortened.

28 Claims, 25 Drawing Sheets

SEMICONDUCTOR MEMORY DEVICE INCORPORATING AN INTERFACE CHIP FOR SELECTIVELY REFRESHING MEMORY CELLS IN CORE CHIPS

BACKGROUND OF THE INVENTION

1. Field of the Invention

The present invention relates to a semiconductor memory device, a memory controller, and a data processing system including these, and more particularly relates to a semiconductor memory device that requires holding of data by a refresh operation, a memory controller that controls the semiconductor memory device, and a data processing system including the semiconductor memory device and the memory controller.

2. Description of Related Art

A DRAM (Dynamic Random Access Memory) as one of representative semiconductor memory devices has a memory cell constituted by one transistor and one capacitor. Therefore, an area occupied per one memory cell is small, and the DRAM has excellent characteristics such that a high integration can be obtained. On the other hand, because data written in the memory cell is lost after a predetermined time, it is necessary to periodically perform a refresh operation.

In the refresh operation, many sense amplifiers are simultaneously activated, and therefore a relatively large current flows. By taking this point into consideration, Japanese Patent Application Laid-open No. 2000-30439 proposes a method of suppressing a peak current by shifting a timing of performing a refresh operation in each bank when a refresh command is issued from outside. This method can be easily achieved by independently providing in each bank a transmission path of a refresh signal within a chip.

Meanwhile, in recent years, there has been proposed a method of configuring a semiconductor memory device by integrating a frontend portion and a backend portion of a DRAM in separate chips and by stacking these chips (Japanese Patent Application Laid-open No. 2007-157266). According to this method, plural core chips in each of which backend portions are integrated have an increased occupied area that can be allocated to a memory core. Therefore, the memory capacity per one chip (per one core chip) can be increased. Meanwhile, an interface chip that has frontend portions integrated therein and is common to plural core chips can be manufactured by a process that is different from a process of manufacturing the memory core. Accordingly, a circuit can be formed by high-speed transistors. Further, because plural core chips can be allocated to one interface chip, it is possible to provide a semiconductor memory device having a very large capacity and high speed as a whole.

In this type of semiconductor memory device, it is very important to manufacture core chips by the same mask to reduce the manufacturing cost.

However, when core chips are manufactured by the same mask, these core chips mutually have the same circuit configurations. Therefore, it becomes difficult to selectively send a signal to a specific core chip from an interface chip. Consequently, in this type of semiconductor memory device, it is difficult to selectively perform a refresh operation by providing plural transmission paths of a refresh signal as described in Japanese Patent Application Laid-open No. 2000-30439.

SUMMARY

In one embodiment, there is provided a semiconductor memory device that includes a semiconductor memory device comprising: a plurality of core chips assigned to mutually different chip information, each of the core chips comprising a plurality of memory cells that require a refresh operation to hold data stored therein; and an interface chip that receives a refresh command and first address information supplied from outside, the first address information relating to the chip information, the interface chip generates at least one time of a refresh control signal based on the refresh command, and supplies the refresh control signal and the first address information in common to the core chips, wherein each of the core chips includes: a determining circuit that determines whether the first address information supplied from the interface chip selects a respective core chip; and a refresh control circuit that performs the refresh operation to the memory cell included in the respective core chip in response to the refresh control signal when the determining circuit determines that the first address information selects the respective core chip.

In another embodiment, there is provided a memory controller that includes a memory controller that controls a semiconductor memory device including an interface chip and a plurality of core chips, the memory controller comprising: a first circuit that issues a refresh command at a plurality of times during a predetermined period; and a second circuit that issues address information that selects the core chips along with the refresh command.

In still another embodiment, there is provided a memory system that includes a memory system comprising: a semiconductor memory device comprising a plurality of core chips and an interface chip that controls the core chips, each of the core chips including a plurality of memory cells and a refresh control circuit that performs refresh operation to the memory cells; and a memory controller that controls the semiconductor memory device, wherein the memory controller includes: a first circuit that issues a refresh command at a plurality of times during a predetermine period; and a second circuit that issues address information that selects the core chips along with the refresh command, the interface chip includes a refresh-control-signal generation circuit that receives the refresh command and the address information that are supplied from the memory controller and generates a refresh control signal in response to the refresh command, the interface chip supplies the refresh control signal and the address information in common to the core chips, each of the core chips includes a determining circuit that determines whether the address information selects a respective core chip, and the refresh control circuit performs the refresh operation to the memory cell in response to the refresh control signal when the address information selects the respective core chip.

According to the present invention, because each of the core chips performs a refresh operation by referring to the address information, a refresh operation can be selectively instructed to each of the core chips even when the refresh control signal is supplied in common to plural core chips. With this configuration, a peak current in the refresh operation can be reduced. Further, even when a certain core chip is performing a refresh operation, an arbitrary command (such as an active command) apart from a refresh command can be issued to other core chips that are not supposed to be refreshed. Therefore, the issuing efficiency of commands can be increased. Because a memory capacity to be refreshed by a refresh command for one time becomes small, a shortest issuing interval of a refresh command can be shortened even when it is necessary to comply with specifications such that a shortest issuing interval of a refresh command becomes long when a memory capacity is large.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
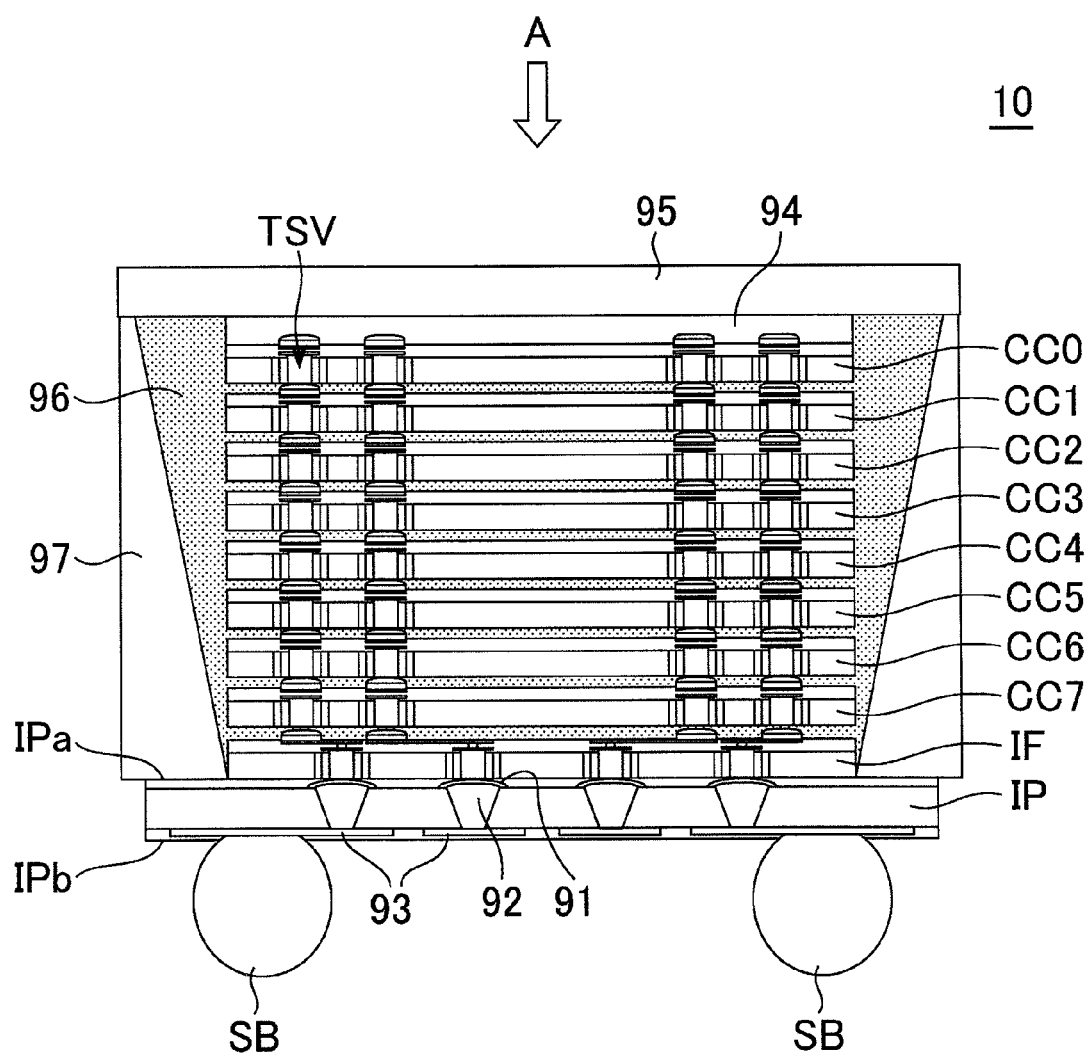
FIG. 1 is a schematic cross-sectional view for explaining a structure of a semiconductor memory device 10 according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment includes 8 core chips CC0 to CC7, an interface chip IF, and an interposer IP that are laminated. The 8 core chips CC0 to CC7 have a same function and structure and are manufactured using a same manufacture mask. The interface chip IF is manufactured using a manufacture mask different from that of the core chips. The core chips CC0 to CC7 and the interface chip IF are semiconductor chips including a silicon substrate and are electrically connected to adjacent chips in a vertical direction through plural Through Silicon Vias (TSV) penetrating the silicon substrate. The interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device of the semiconductor memory device 10 through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells. The SDRAM operates even as a single chip and is capable of communicating directly with a memory controller. That is, each of the core chips CC0 to CC7 is a semiconductor chip where only the circuit blocks belonging to the back end unit are integrated in principle. A parallel-serial converting circuit (data latch circuit) and a DLL (Delay Locked Loop) circuit are circuit blocks that are included in the front end unit. The parallel-serial converting circuit (data latch circuit) performs parallel/serial conversion on input/output data between a memory cell array and a data input/output terminal. The DLL circuit controls input/output timing of data. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may also be disposed on the back surface IPb of the interposer IP. When the interface chip IF is disposed on the core chips CC0 to CC7 in a face-down manner or is disposed on the back surface IPb of the interposer IP in a face-up manner, the through silicon vias TSV do not need to be provided in the interface chip IF. The interface chip IF may be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
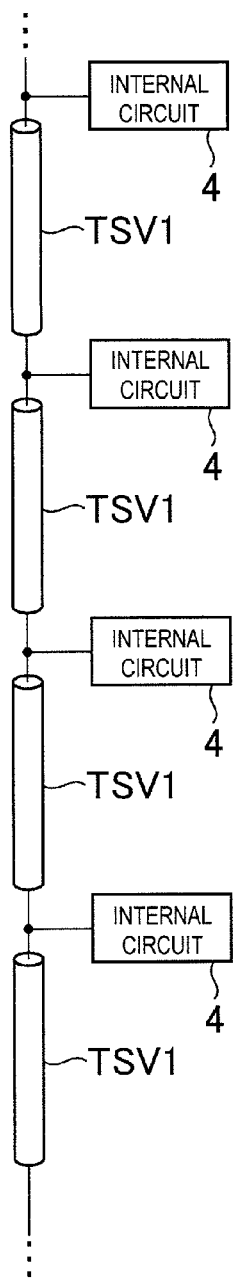
FIGS. 2A to 2C are diagram for explaining various types of through silicon vias TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
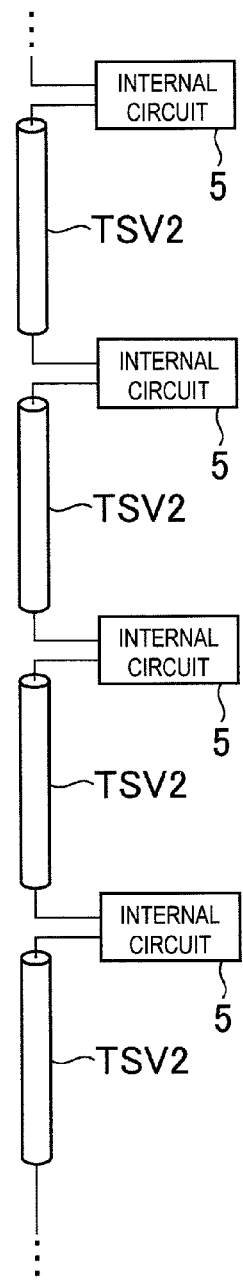

Meanwhile, as shown in FIG. 2B, a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. The internal circuits that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. This information which is layer address information (chip information) is described below.

Figure 2C:
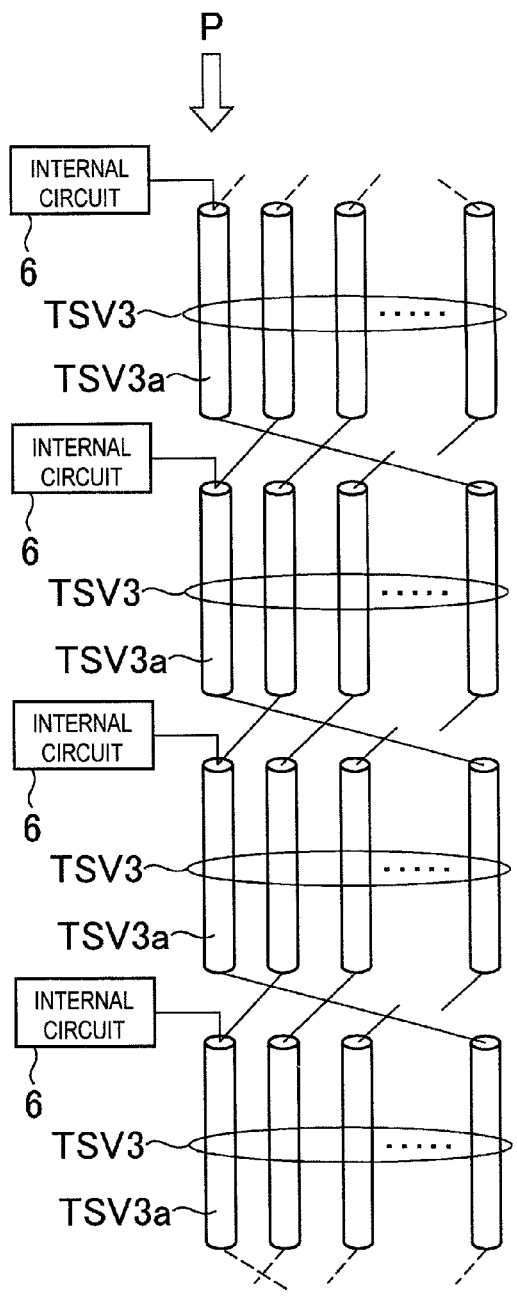

Another through silicon via TSV group is short-circuited from the through silicon vias TSV of other layer provided at the different position in plain view, as shown in FIG. 2C. With respect to this kind of through silicon via TSV group 3, internal circuits 6 of the core chips CC0 to CC7 are connected to the through silicon via TSV3a provided at the predetermined position P in plain view. Thereby, information can be selectively input to the internal circuits 6 provided in the core chips. This information which is defective chip information is described below.

As such, three types of the through silicon vias TSV exist and are provided in the core chips CC0 to CC7. The three types of TSVs TSV1 to TSV3 are shown in FIGS. 2A to 2C, respectively. As described above, most of the through silicon vias TSV are of a type shown in FIG. 2A, and an address signal, a command signal, and a clock signal are supplied from the interface chip IF to the core chips CC0 to CC7, through the through silicon via TSV1 shown in FIG. 2A. Read data and write data are input to and output from the interface chip IF through the through silicon via TSV1 shown in FIG. 2A. Meanwhile, the through silicon via TSV2 and through silicon via TSV3 shown in FIGS. 2B and 2C, respectively, are used to provide individual information to the core chips CC0 to CC7 having the same structure.

Figure 3:
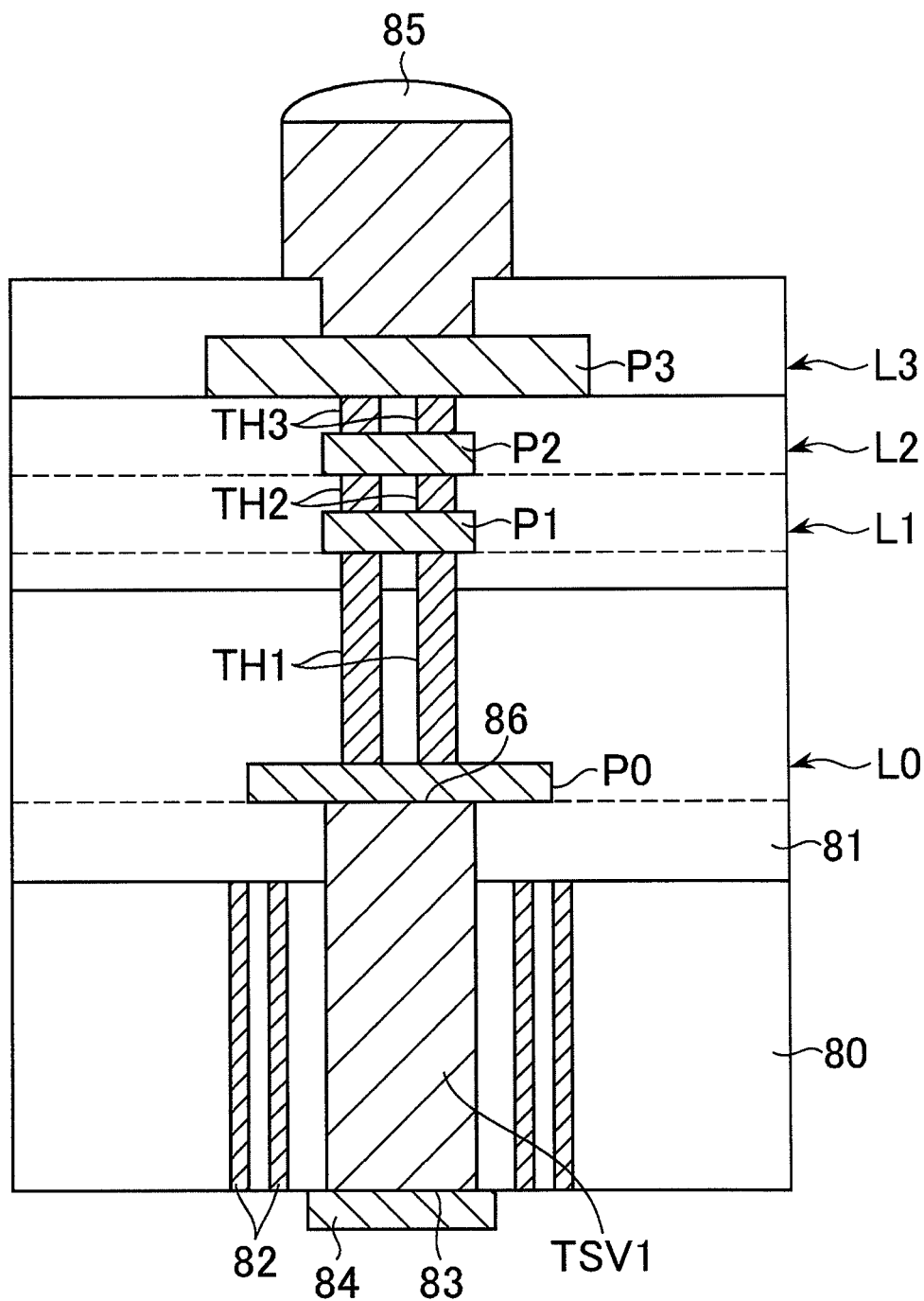
FIG. 3 is a cross-sectional view showing a structure of the through silicon via TSV of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, two insulating rings 82 are provided. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
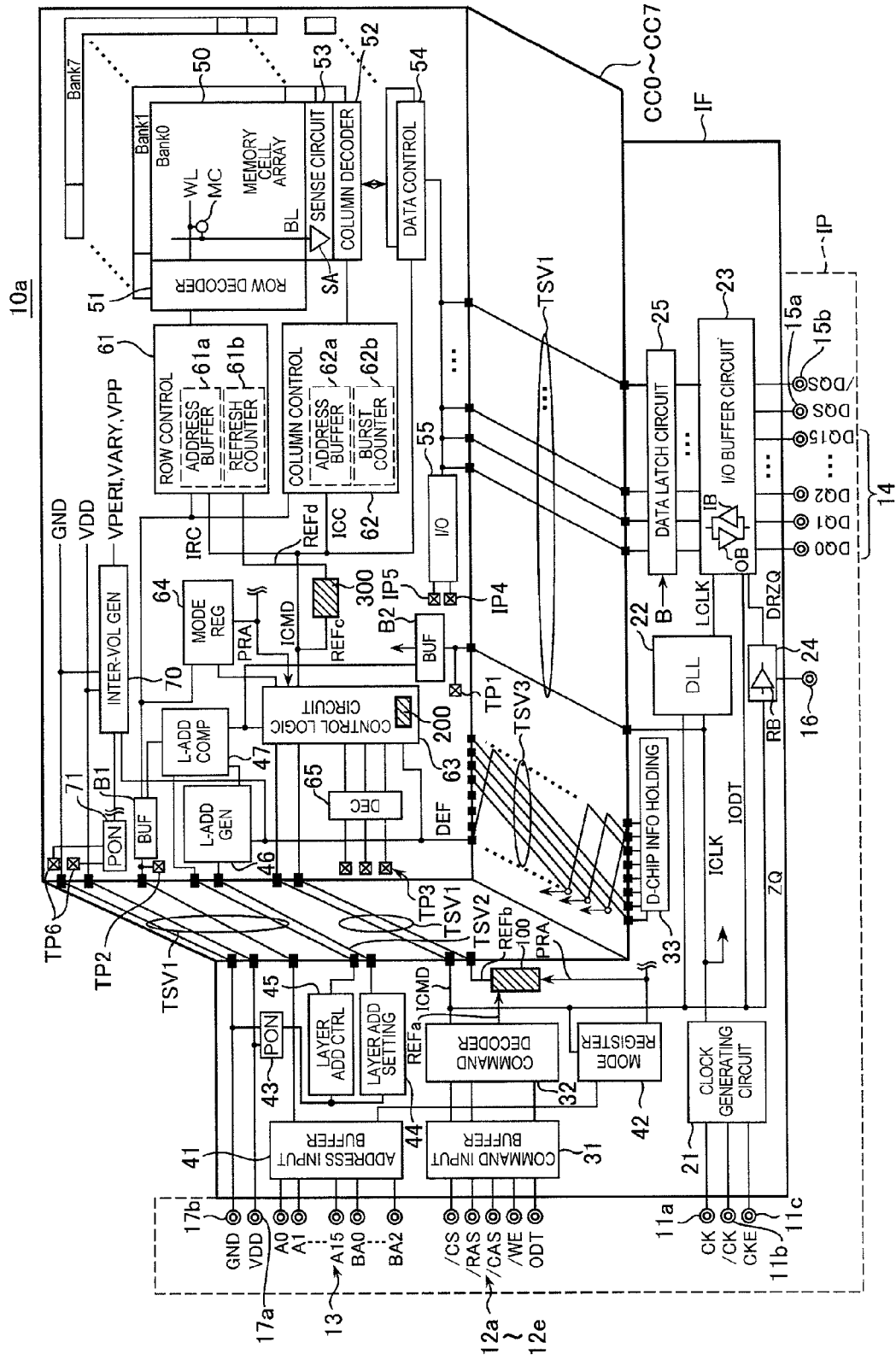
FIG. 4 is a block diagram showing a circuit configuration of the semiconductor memory device 10.

FIG. 4 is a block diagram illustrating the circuit configuration of the semiconductor memory device 10.

As shown in FIG. 4, the external terminals that are provided in the interposer IP include clock terminals 11a and 11b, a clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

Further, the interface chip IF includes a refresh-control-signal generation circuit 100, and when an auto-refresh command (hereinafter, simply "refresh command") is input (supplied) to the command decoder 32 from outside of the semiconductor memory device 10, the command decoder 32 supplies an internal refresh command REFa to the inside of the refresh-control-signal generation circuit 100. Although details thereof are described later, when a first operation mode is selected, the refresh-control-signal generation circuit 100 directly supplies the internal refresh command REFa for one time as a refresh control signal REFb for one time to the core chips CC0 to CC7, and when a second operation mode is selected, the refresh-control-signal generation circuit 100 generates the refresh control signal REFb for plural times based on the internal refresh command REFa for one time, and functions to supply the generated refresh control signals REFb to the core chips CC0 to CC7. An operation mode is assigned based on a mode selection signal PRA that is supplied from a mode register 42.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address input buffer 41 takes in respectively from outside the address signals A0 to A15 and BA0 to BA2 that are supplied from outside of the semiconductor memory device 10, and holds (determines) the signals, based on control of the command input buffer 31. This corresponds to edges of the external clock signals CK and /CK relevant to the clock generation circuit. That is, the address input buffer 41 included in the interface chip IF operates to satisfy a setting up and holding time of a so-called supplied-input signal based on the edges of the external clock signals CK and /CK, which are necessary to communicate outside of the semiconductor memory device 10. The address input buffer 41 supplies the address signals determined via a through silicon via TSV to the input buffer B1 via a relevant through silicon via TSV. The address signals A0 to A15 are supplied to a mode register 42 provided in the interface chip IF, when the semiconductor memory device 10 enters a mode register set. The mode register 42 is set in advance with the whole operation modes or the like of the semiconductor memory device 10. When the semiconductor memory device 10 is set in the first operation mode, the mode selection signal PRA becomes at a high level. When the semiconductor memory device 10 is set in the second operation mode, the mode selection signal PRA becomes at a low level. As shown in FIG. 4, the mode selection signal PRA is supplied to the refresh-control-signal generation circuit 100. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF. Among the address signals A0 to A15, three bits of the address signals A13, A14, and A15 are information for selecting the core chips CC0 to CC7, and are occasionally referred to as address information SIDADD.

The data input/output terminal 14 is used to input/output read data or write data DQ0 to DQ15 relevant to external access. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation matches the impedance of the replica buffer RB with the resistance value of the external resistor, and supplies the obtained impedance code DRZQ to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

A function for enabling a test in an interface chip unit is added to the data latch circuit 25. The interface chip IF does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect, which cannot be recovered, exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip, which does not operate normally, is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. These banks are a unit that can individually receive a command. In other words, the banks are independent regions that can mutually independently operate based on non-exclusive control. Each back can be independently accessed from the outside of the semiconductor memory device 10. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. Therefore, data in the bank 1 and data in the bank 2 are input to and output from external terminals of the semiconductor memory device via I/O terminals at mutually different times in a time axis. In each of the memory cell arrays 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52. Because the memory cell MC is a DRAM cell, a data holding operation is necessary at each predetermined time by a refresh operation.

Figure 5:
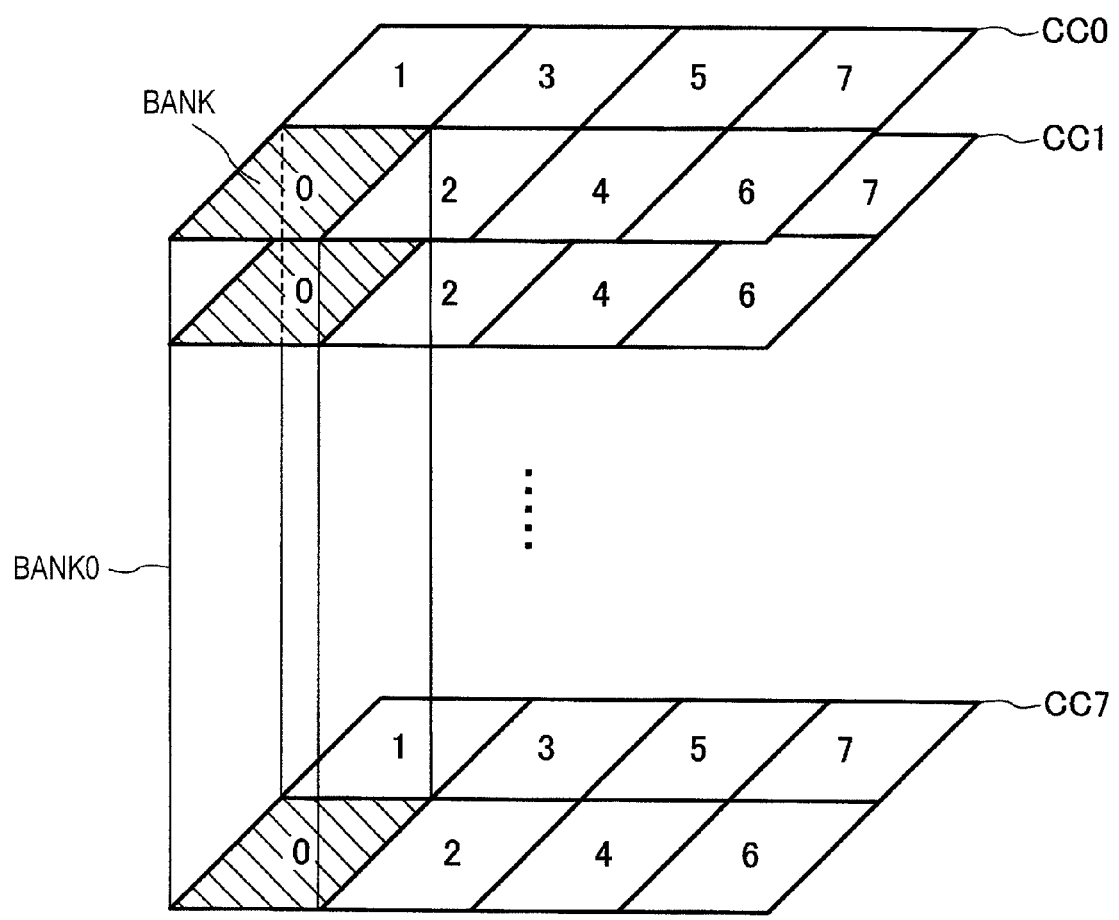
FIG. 5 is a schematic diagram for explaining a bank configuration of the semiconductor memory device 10.

Because the semiconductor memory device 10 according to the present embodiment includes eight core chips, there are 64 banks in total. However, from outside of the semiconductor memory device such as a memory controller, as shown in FIG. 5, banks 0 of the core chips CC0 to CC7 are collectively recognized as one bank, and similarly, banks 1 of the core chips CC0 to CC7 are collectively recognized as one bank, banks 2 of the core chips CC0 to CC7 are collectively recognized as one bank, and so on. Therefore, the memory controller recognizes that a DRAM includes eight banks. By setting each bank of the core chips CC0 to CC7 as an independent region, plural independent regions in which the independent regions are collected as one by crossing the core chips CC0 to CC7 are occasionally referred to as one memory bank.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. Further, the row control circuit also includes a refresh counter 61b, and when a refresh-control-signal dividing circuit 300 issues a refresh control signal REFd, a bank address and a row address indicated by the refresh counter 61b is supplied to the row decoder 51 in place of the address signal that supplies via the through silicon via TSV. The refresh control signal REFd is generated via the refresh control signal REFb that is supplied from the interface chip IF to the control logic circuit 63 of the core chip via the through silicon via TSV, and via a refresh control signal REFc that is supplied to the refresh-control-signal dividing circuit 300 from the control logic circuit 63. This configuration is described in detail later.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62 in the core chip, based on the internal command ICMD. The control logic circuit 63 is connected to a layer address comparing circuit (determining circuit) 47. The layer address comparison circuit 47 detects whether a corresponding core chip is to be accessed, and the layer address comparison circuit 47 performs the detection by comparing the address information SIDADD as a part of an address signal supplied from the interface IF via the through silicon via TSV with a layer address SID (chip identification information) that is set in the layer-address generation circuit 46. The layer address SID is a signal having been determined by a predetermined operation within the semiconductor memory device before a command of read, write, or refresh is supplied to the semiconductor memory device from outside.

The control logic circuit 63 includes a refresh control circuit 200. Although details thereof are described later, the refresh control circuit 200 directly outputs as the refresh control signal REFc for one time the refresh control signal REFb for one time that is supplied from the interface IF when the first operation mode is selected. When the second operation mode is selected, the refresh control circuit 200 counts the refresh control signal REFb that is supplied for plural times from the interface chip IF, and functions to activate the refresh control signal REFc when a predetermined count value is obtained. An operation mode is assigned by the mode selection signal PRA that is supplied from a mode register 64. The refresh control signal REFc is supplied to the refresh-control-signal dividing circuit 300. The refresh-control-signal dividing circuit 300 activates the refresh control signal REFd for plural times when the refresh control signal REFc is activated for one time. The refresh control signal REFd is supplied to the refresh counter 61b within the row control circuit 61, and causes to refresh the bank address and the row address indicated by the refresh counter 61b. It suffices that there is at least any one of the mode register 64 included in each of the core chips CC0 to CC7 and the mode register 42 included in the interface chip IF, within the semiconductor memory device 10. In this case, the mode selection signal PRA is supplied to another chip via the through silicon via TSV from a chip in which a mode register is arranged.

In the layer address generating circuit 46, unique layer addresses are set to the core chips CC0 to CC7, respectively, at initialization of the semiconductor memory device. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A layer address having a maximum value (1, 1, 1) is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. The layer address generating circuit 46 transmits a non-incremented layer address, not an incremented layer address, to the core chip of the lower layer when the defective chip signal DEF is activated. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS.

The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 6:
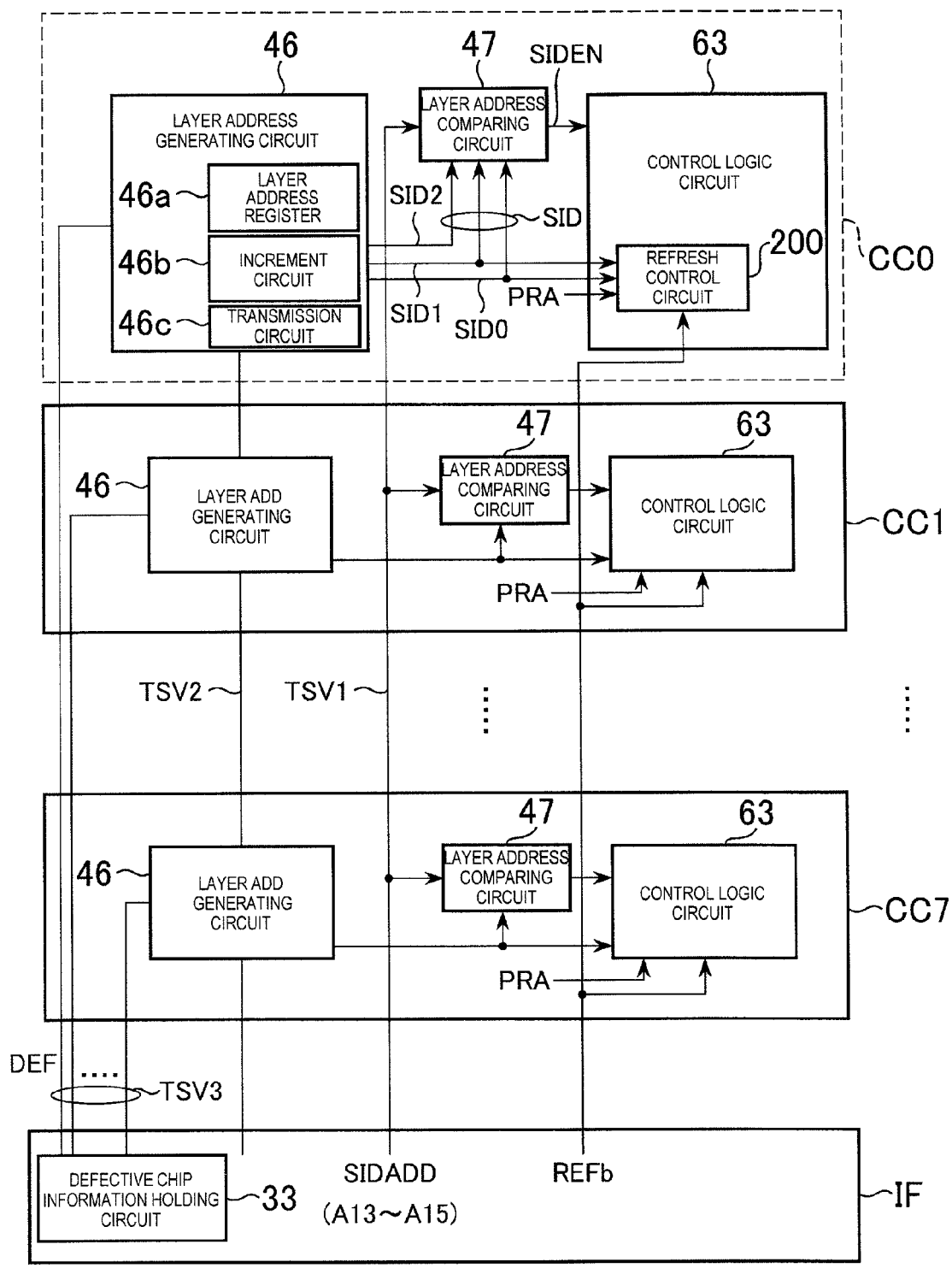
FIG. 6 is a diagram showing an extract of circuits relevant to generation of a layer address.

FIG. 6 shows an extract of circuits relevant to generation of a layer address.

As shown in FIG. 6, the layer-address generation circuit 46 is provided in each of the core chips CC0 to CC7, and these layer-address generation circuits 46 are connected in cascade via the through silicon via TSV2 of the type shown in FIG. 2B. Each layer-address generation circuit 46 includes a layer address register 46a, an increment circuit 46b, and a transfer circuit 46c.

The layer address register 46a holds a layer address (chip identification information) SID of three bits. When the power-on detection circuit 71 shown in FIG. 4 detects an input of a power source, this value is initialized to a minimum value (0, 0, 0). In the core chip CC0 of a top layer, a value (0, 0, 1) obtained by the increment circuit 46b by incrementing a layer address SID (0, 0, 0) set in the layer address register 46a is generated. The transfer circuit 46c transfers the layer address SID (0, 0, 1) of the incremented value to the core chip CC1 of a lower layer. The transferred layer address SID (0, 0, 1) is set in the layer address register 46a of the core chip CC1.

In the core chip CC1, a value (0, 1, 0) obtained by the increment circuit 46b by incrementing the layer address SID (0, 0, 1) set in the layer address register 46a is generated. The transfer circuit 46c transfers a layer address SID (0, 1, 0) of the incremented values to the core chip CC2 of a lower layer.

Thereafter, similarly, incremented layer addresses SID are sequentially transferred to core chips of lower layers. Finally, a maximum value (1, 1, 1) is set as a layer address SID in the layer address register 46a of the core chip CC7 of the lowest layer. With this configuration, specific layer addresses SID are set in the core chips CC0 to CC7, respectively.

The defective-chip signal DEF is supplied to the layer-address generation circuit 46 from the defective-chip-information holding circuit 33 of the interface chip IF via the through silicon via TSV3 of the type shown in FIG. 2C. The defective-chip signal DEF is a signal having eight bits, and each bit is supplied to a corresponding one of the core chips CC0 to CC7. A core chip of which a bit corresponding to the defective-chip signal DEF is active is a defective chip. In the core chip of which a bit corresponding to the defective-chip signal DEF is active, the transfer circuit 46c transfers a non-incremented layer address SID, not an incremented layer address SID, to a core chip of a lower layer. Accordingly, the defective chip is skipped when allocating a layer address SID. That is, a layer address SID that is allocated to each of the core chips CC0 to CC7 is not fixed, but is variable depending on the defective-chip signal DEF. Although a layer address SID that is the same as that of a core chip of a lower layer is allocated to a defective chip, activation of the control logic circuit 63 is prohibited in the defective chip. Therefore, a read operation or a write operation is not actually performed even when an address signal or a command signal is input to the defective chip from the interface chip IF.

A layer address SID having been set as described above is supplied to the layer address comparison circuit 47 within the same core chip among the core chips CC0 to CC7. The layer address comparison circuit 47 constitutes "determining circuit" that determines whether the address information SIDADD that is supplied from the interface chip IF assigns the self-core chip. The layer address comparison circuit 47 compares the layer address SID that is supplied from the layer-address generation circuit 46 with the address information SIDADD as a part of the address signal that is supplied from the interface chip IF via the through silicon via TSV. When the layer address SID and the address information SIDADD match each other, the layer address comparison circuit 47 activates an enable signal SIDEN. The address information SIDADD is high-order three bits (A13, A14, and A15) of the address signal. Because the address information SIDADD is supplied in common to the core chips CC0 to CC7 via the through silicon via TSV1 of the type shown in FIG. 2A, only one core chip is detected to match by the layer address comparison circuit 47 in the semiconductor memory device 10. When the layer address comparison circuit 47 detects a match, a corresponding one of the control logic circuits 63 is activated, and the internal command ICMD supplied from the interface chip IF becomes valid.

SID0 and SID1 as low-order two bits of the layer address SID are also directly supplied to the refresh control circuit 200 within the control logic circuit 63. The mode selection signal PRA is also supplied to the refresh control circuit 200. Accordingly, when the refresh control signal REFb is supplied from the interface chip IF, the refresh control circuit 200 generates the refresh control signal REFc based on the enable signal SIDEN when the first operation mode is selected by the mode selection signal PRA. On the other hand, when the second operation mode is selected by the mode selection signal PRA, the refresh control circuit 200 generates the refresh control signal REFc based on SID0 and SID1 as low-order two bits of the layer address SID.

Figure 7:
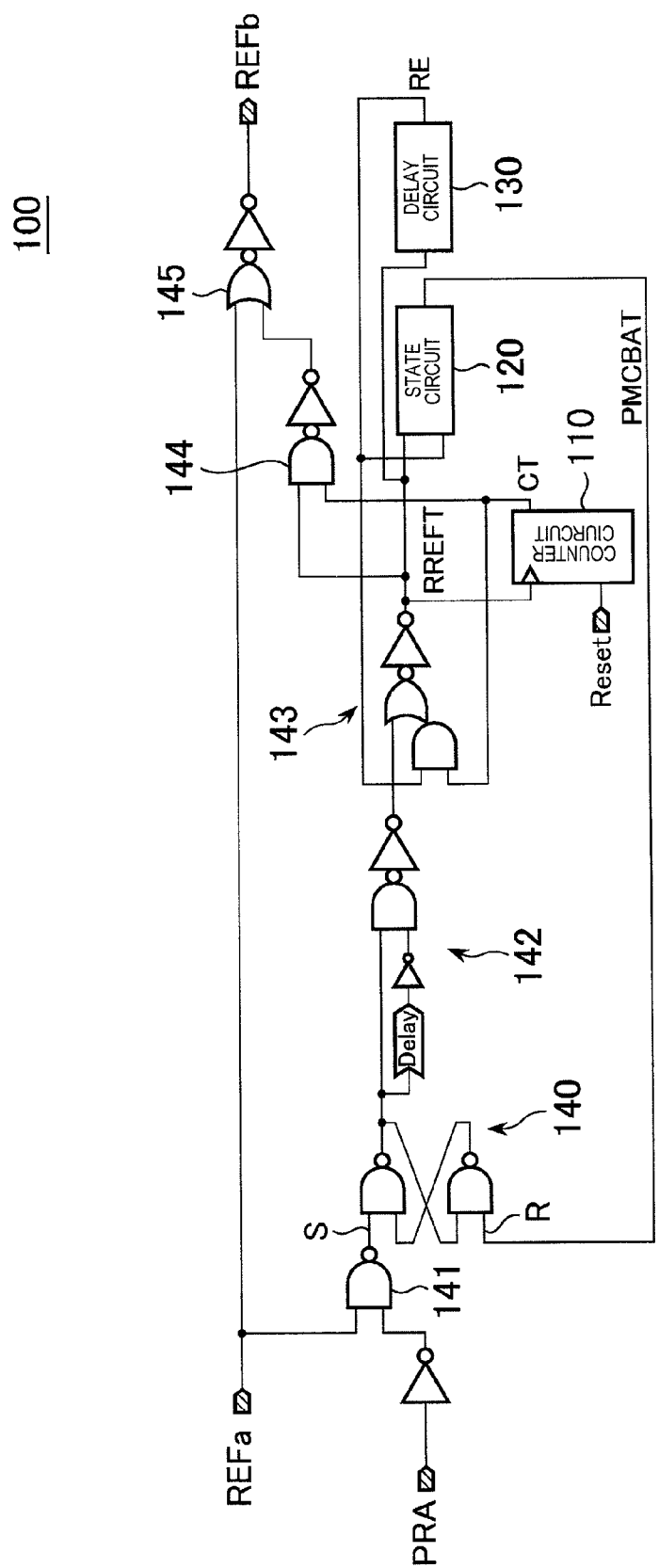
FIG. 7 is a circuit diagram of a refresh-control-signal generation circuit 100.

FIG. 7 is a circuit diagram of the refresh-control-signal generation circuit 100 included in the interface chip IF.

As shown in FIG. 7, the refresh-control-signal generation circuit 100 includes a counter circuit 110, a state circuit 120, a delay circuit 130, and an SR latch circuit 140. An output of a NAND gate circuit 141 that receives the internal refresh command REFa and an inversion signal of the mode selection signal PRA is supplied to a set input terminal (S) of the SR latch circuit 140. Therefore, when the mode selection signal PRA is at a high level (the first operation mode), setting of the SR latch circuit 140 is prohibited. On the other hand, when the mode selection signal PRA is at a low level (the second operation mode), the SR latch circuit 140 is set in response to activation of the internal refresh command REFa.

An output of the SR latch circuit 140 is supplied to a one-shot-pulse generation circuit 142 and to a complex gate circuit 143. An internal signal RREFT as an output of the complex gate circuit 143 is input, together with a count signal CT as an output of a counter circuit 110, to an AND gate circuit 144. An output of the AND gate circuit 144 is input, together with the internal refresh command REFa, to an OR gate circuit 145. An output of the OR gate circuit 145 is used as the refresh control signal REFb.

Figure 8:
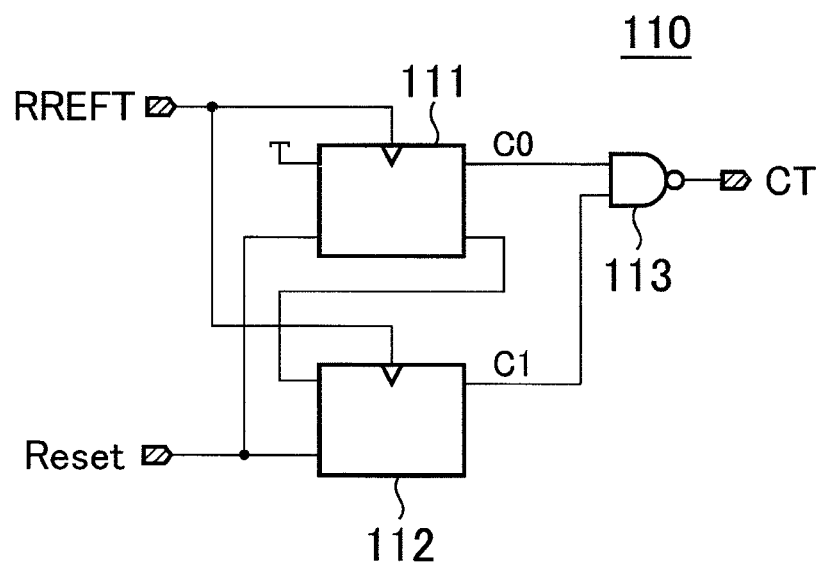
FIG. 8 is a circuit diagram of a counter circuit 110.

FIG. 8 is a circuit diagram of the counter circuit 110.

Figure 9:
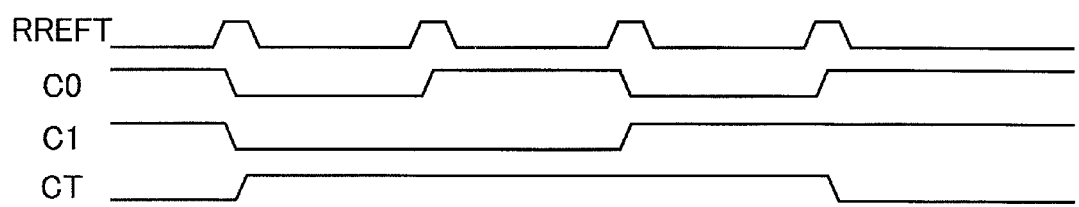
FIG. 9 is a timing chart for explaining an operation of the counter circuit 110.

As shown in FIG. 8, the counter circuit 110 includes two flip-flop circuits 111 and 112, and a NAND gate circuit 113 that receives output bits C0 and C1 of the flip-flop circuits 111 and 112. The internal signal RREFT is input to clock input terminals of the flip-flop circuits 111 and 112. Because the two flip-flop circuits 111 and 112 are connected in cascade as shown in FIG. 8, these circuits constitute a 2-bit binary counter. That is, as shown in FIG. 9, the output bit C0 of the flip-flop circuit 111 is inverted each time when the internal signal RREFT is activated, and the output bit C1 of the flip-flop circuit 112 is inverted each time when the internal signal RREFT is activated for two times. Therefore, the count signal CT that is at a low level at an initial state becomes at a high level in response to activation of the internal signal RREFT, and returns to a low level in response to the fourth activation of the internal signal RREFT. The count values C0 and C1 of the counter circuit 110 are reset to C0, C1=(0, 0) in response to a reset signal Reset.

As shown in FIG. 7, the internal signal RREFT is also supplied to the state circuit 120 and to the delay circuit 130. The state circuit 120 sets a refresh state signal PMCBAT at a high level during a constant period after the internal signal RREFT is activated. The refresh state signal PMCBAT shows a refresh period, and is supplied to a reset input terminal (R) of the SR latch circuit 140. The delay circuit 130 generates a delay signal RE that is obtained by delaying the internal signal RREFT. The delay signal RE is supplied to the complex gate circuit 143.

Figure 10:
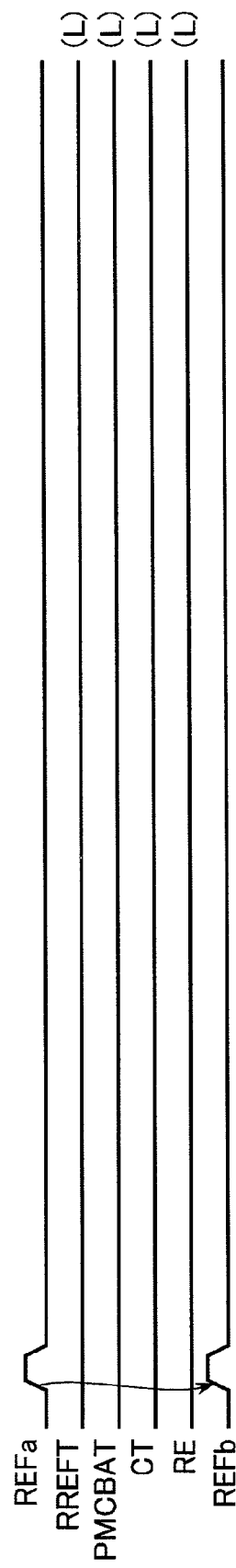
FIG. 10 is a timing diagram for explaining an operation of the refresh-control-signal generation circuit 100 when a first operation mode is selected.
Figure 11:
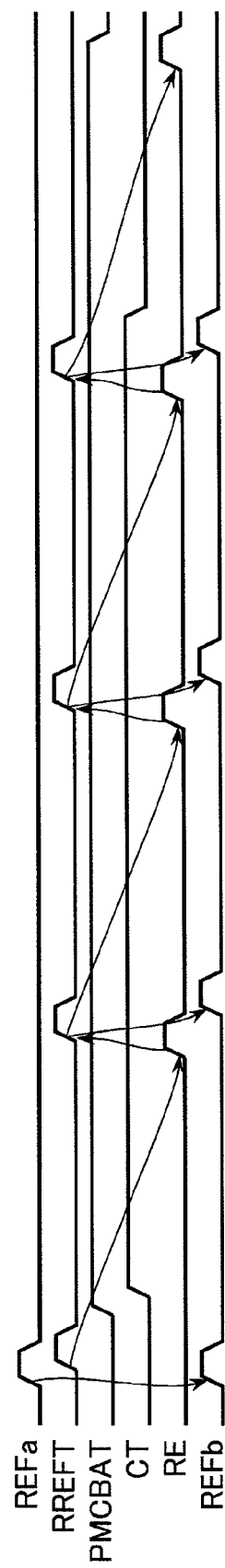
FIG. 11 is a timing diagram for explaining an operation of the refresh-control-signal generation circuit 100 when a second operation mode is selected.

FIGS. 10 and 11 are timing diagrams for explaining operations of the refresh-control-signal generation circuit 100, where FIG. 10 shows an operation when the first operation mode is selected and FIG. 11 shows an operation when the second operation mode is selected.

As described above, the refresh-control-signal generation circuit 100 included in the interface chip IF fixes the internal signal RREFT at a low level as shown in FIG. 10 because the SR latch circuit 140 is not set in the first operation mode in which the mode selection signal PRA is at a high level. Therefore, only the refresh control signal REFb is generated for one time in response to the internal refresh command REFa for one time, and the counter circuit 110 does not perform a count operation.

On the other hand, in the second operation mode in which the mode selection signal PRA is at a low level, the SR latch circuit 140 is set in response to the internal refresh command REFa for one time, and therefore the internal signal RREFT is activated, as shown in FIG. 11. This internal signal RREFT is input to the delay circuit 130, and is fed back to the complex gate circuit 143 as the delay signal RE. Therefore, the internal signal RREFT is activated for plural times in a predetermined cycle. The internal signal RREFT is output as the refresh control signal REFb via the AND gate circuit 144 and the OR gate circuit 145. Therefore, the refresh control signal REFb is also activated in a predetermined cycle.

The counter circuit 110 counts the number of times of activating the internal signal RREFT, and the count signal CT changes to a low level at a fourth count. Accordingly, activation of the refresh control signal REFb based on the internal signal RREFT is prohibited. Thereafter, the refresh state signal PMCBAT changes to a low level, and the SR latch circuit 140 is reset.

As explained above, in the second operation mode, the refresh-control-signal generation circuit 100 included in the interface chip IF activates the refresh control signal REFb for four times in response to the internal refresh command REFa for one time. Out of activation for four times, the first activation is based on passing of the internal refresh command REFa through the OR gate circuit 145, and the second to fourth activation is automatically made by the complex gate circuit 143 and the delay circuit 130 that are connected in a loop shape.

Figure 12:
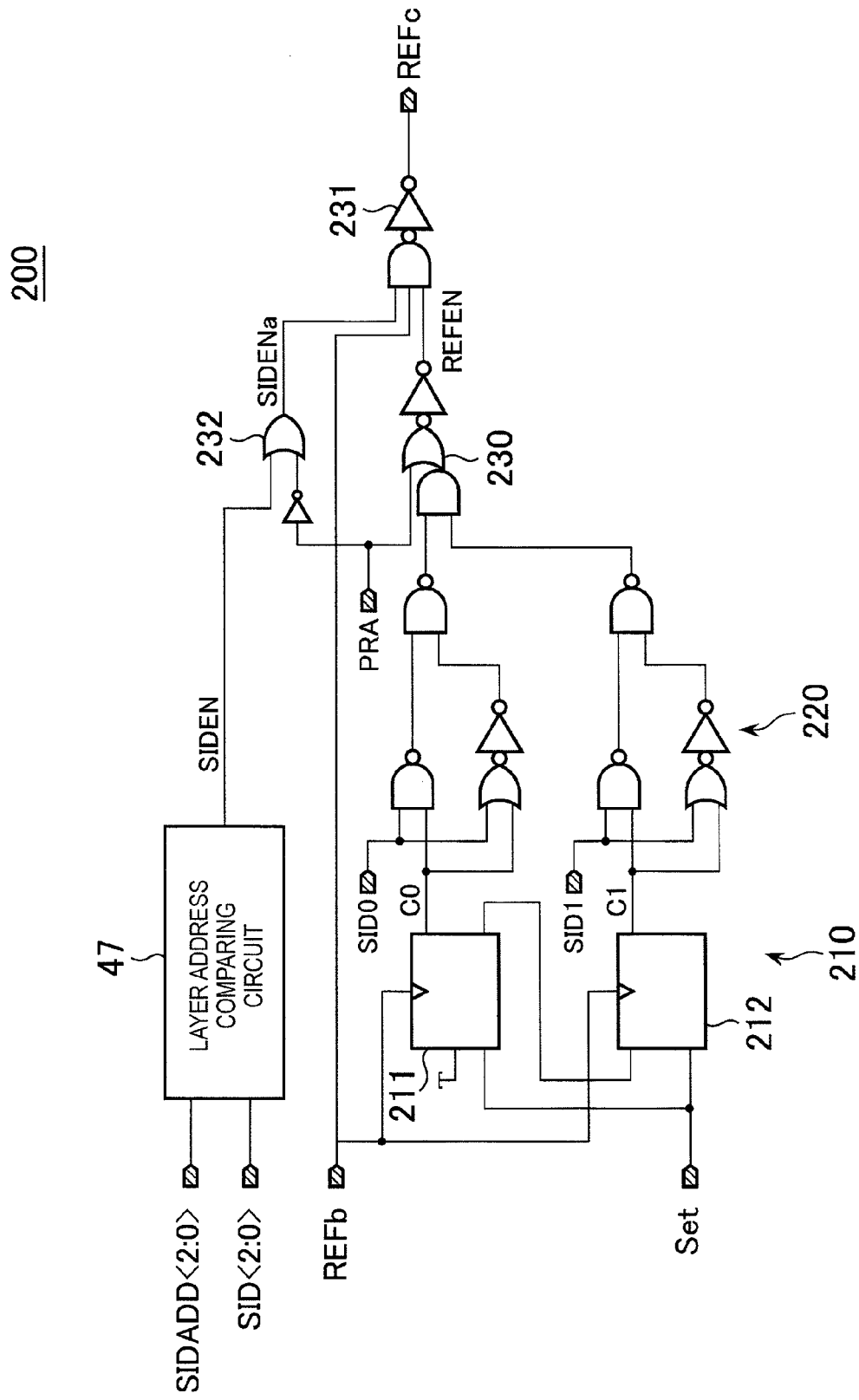
FIG. 12 is a circuit diagram of a refresh control circuit 200.

FIG. 12 is a circuit diagram of the refresh control circuit 200 included in each of the core chips CC0 to CC7.

As shown in FIG. 12, the refresh control circuit 200 includes a counter circuit 210 that counts the refresh control signal REFb supplied from the interface chip IF, and a comparison circuit 220 that compares output bits C0 and C1 of the counter circuit 210 with low-order two bits (SID0 and SID1) of the layer address SID, respectively.

The counter circuit 210 is a 2-bit binary counter consisting of two flip-flop circuits 211 and 212 that are connected in cascade. The refresh control signal REFb is input to a clock input terminal of each of these flip-flop circuits. Therefore, the output bit C0 of the flip-flop circuit 211 is inverted each time when the refresh control signal REFb is activated, and the output bit C1 of the flip-flop circuit 212 is inverted each time when the refresh control signal REFb is activated for two times. Count values C0 and C1 of the counter circuit 210 are set to arbitrary values such as C0, C1=(0, 0), for example, in response to a set signal Set.

The comparison circuit 220 compares two bits of the count values C0 and C1 with the low-order two bits (SID0 and SID1) of the layer address SID, respectively. When all of the respective bits match each other, the comparison circuit 220 activates an enable signal REFEN via a complex gate circuit 230. The enable signal REFEN and the refresh control signal REFb are input to an AND gate circuit 231 having three inputs. An output of the AND gate circuit 231 is used as the refresh control signal REFc.

An enable signal SIDENa is input to a remaining input of the AND gate circuit 231. The enable signal SIDENa is supplied from an OR gate circuit 232. The enable signal SIDEN and an inversion signal of the mode selection signal PRA are supplied to the OR gate circuit 232. The mode selection signal PRA is also supplied to the complex gate circuit 230. Accordingly, when the mode selection signal PRA is at a high level (the first operation mode), the enable signal REFEN is activated at a high level regardless of an operation of the comparison circuit 220, and meanwhile, a logic level of the enable signal SIDENa matches a logic level of the enable signal SIDEN. On the other hand, when the mode selection signal PRA is at a low level (the second operation mode), the enable signal SIDENa is activated at a high level regardless of an operation of the layer address comparison circuit 47, and meanwhile, the enable signal REFEN is activated at a high level only when the comparison circuit 220 detects a match.

Figure 13:
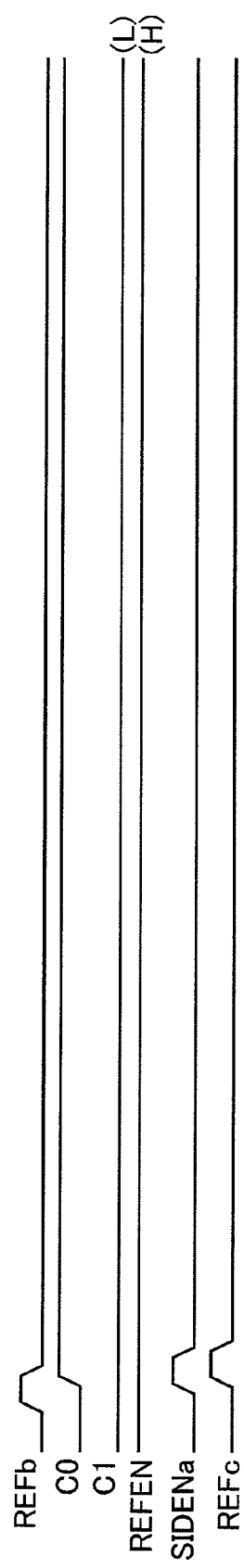
FIG. 13 is a timing diagram for explaining an operation of the refresh control circuit 200 when the first operation mode is selected.
Figure 14:
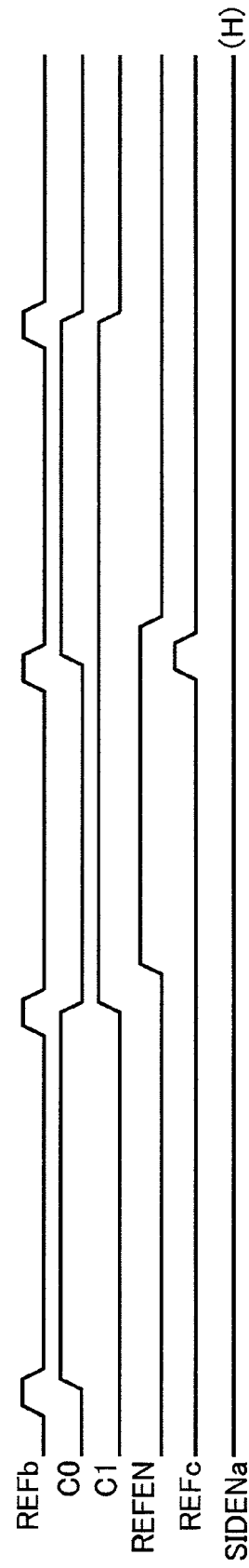
FIG. 14 is a timing diagram for explaining an operation of the refresh control circuit 200 when the second operation mode is selected.

FIGS. 13 and 14 are timing diagrams for explaining an operation of the refresh control circuit 200 included in each of the core chips CC0 to CC7, where FIG. 13 shows an operation when the first operation mode is selected and FIG. 14 shows an operation when the second operation mode is selected.

As shown in FIG. 13, the refresh control circuit 200 included in each of the core chips CC0 to CC7 activates the enable signal REFEN at a high level regardless of an operation of the comparison circuit 220 in the first operation mode in which the mode selection signal PRA is at a high level. On the other hand, a logic level of the enable signal SIDENa matches a logic level of the enable signal SIDEN. Therefore, the refresh control circuit 200 included in each of the core chips CC0 to CC7 activates the refresh control signal REFc for one time in response to the refresh control signal REFb for one time in a condition that the layer address comparison circuit 47 detects a match.

Figure 19:
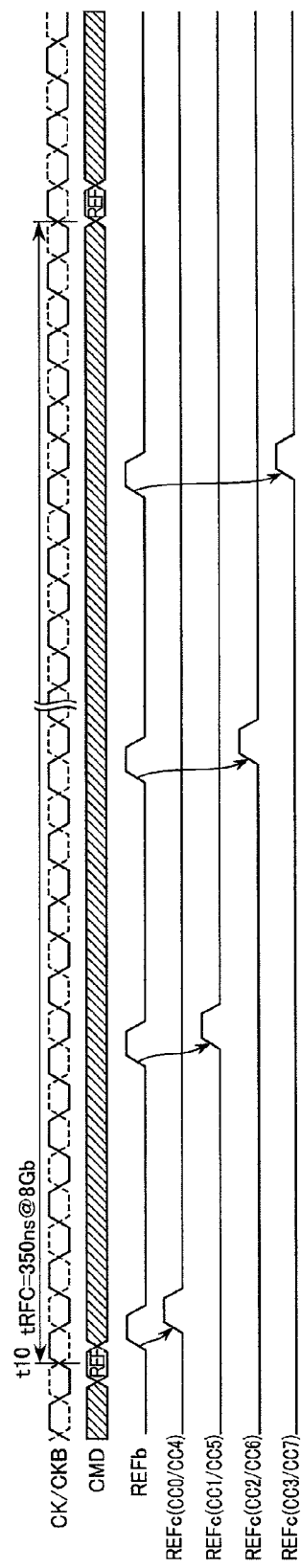
FIG. 19 is a timing diagram for explaining an operation of the semiconductor memory device 10 when the second operation mode is selected.

On the other hand, in the second operation mode in which the mode selection signal PRA is at a low level, the enable signal SIDENa is fixed at a high level as shown in FIG. 14. Meanwhile, because the enable signal REFEN is activated only when the comparison circuit 220 detects a match, the refresh control signal REFc in each of the core chips CC0 to CC7 is activated for one time each time when the refresh control signal REFb supplied from the interface chip IF is activated for four times. In an example shown in FIG. 14, an output of the refresh control circuit 200 of each of the core chips CC2 and CC6 is shown. Low-order two bits SID0 and SID1 of the layer address SID are equal to 1 and 0 (these indicate two core chips CC2 and CC6). Therefore, the refresh control signal REFc is activated when the refresh control signal REFb is activated when count values of the counter circuit 210 are C0, C1=1, 0. That is, the core chips CC2 and CC6 are refreshed in response to the third activation of the refresh control signal REFb out of activation of the refresh control signal REFb for four times. Similarly, the refresh control circuit 200 of each of the core chips CC0 and CC4 generates the refresh control signal REFc in response to the first activation of the refresh control signal REFb out of activation of the refresh control signal REFb for four times. The refresh control circuit 200 of each of the core chips CC1 and CC5 generates the refresh control signal REFc in response to the second activation of the refresh control signal REFb out of activation of the refresh control signal REFb for four times. The refresh control circuit 200 of each of the core chips CC3 and CC7 generates the refresh control signal REFc in response to the fourth activation of the refresh control signal REFb out of activation of the refresh control signal REFb for four times. These generations are shown in FIG. 19.

Figure 15:
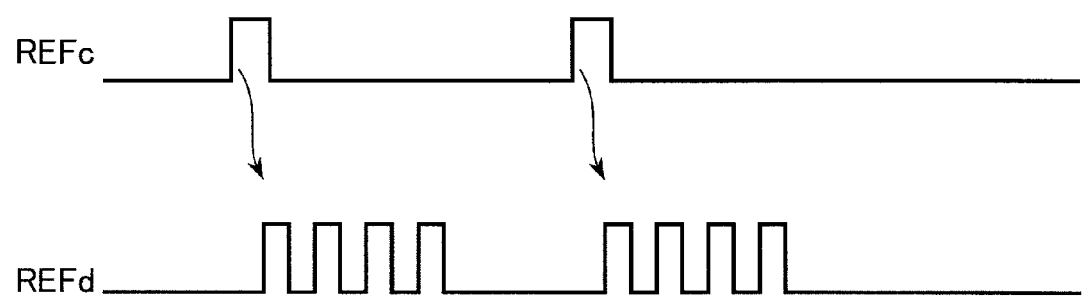
FIG. 15 is a timing diagram for explaining an operation of a refresh-control-signal dividing circuit 300.

FIG. 15 is a timing diagram for explaining an operation of the refresh-control-signal dividing circuit 300 included in each of the core chips CC0 to CC7.

As shown in FIG. 15, the refresh-control-signal dividing circuit 300 generates in time series the refresh control signal REFd for four times in response to the refresh control signal REFc for one time. The refresh control signal REFd is supplied to the refresh counter 61b shown in FIG. 4.

Figure 16:
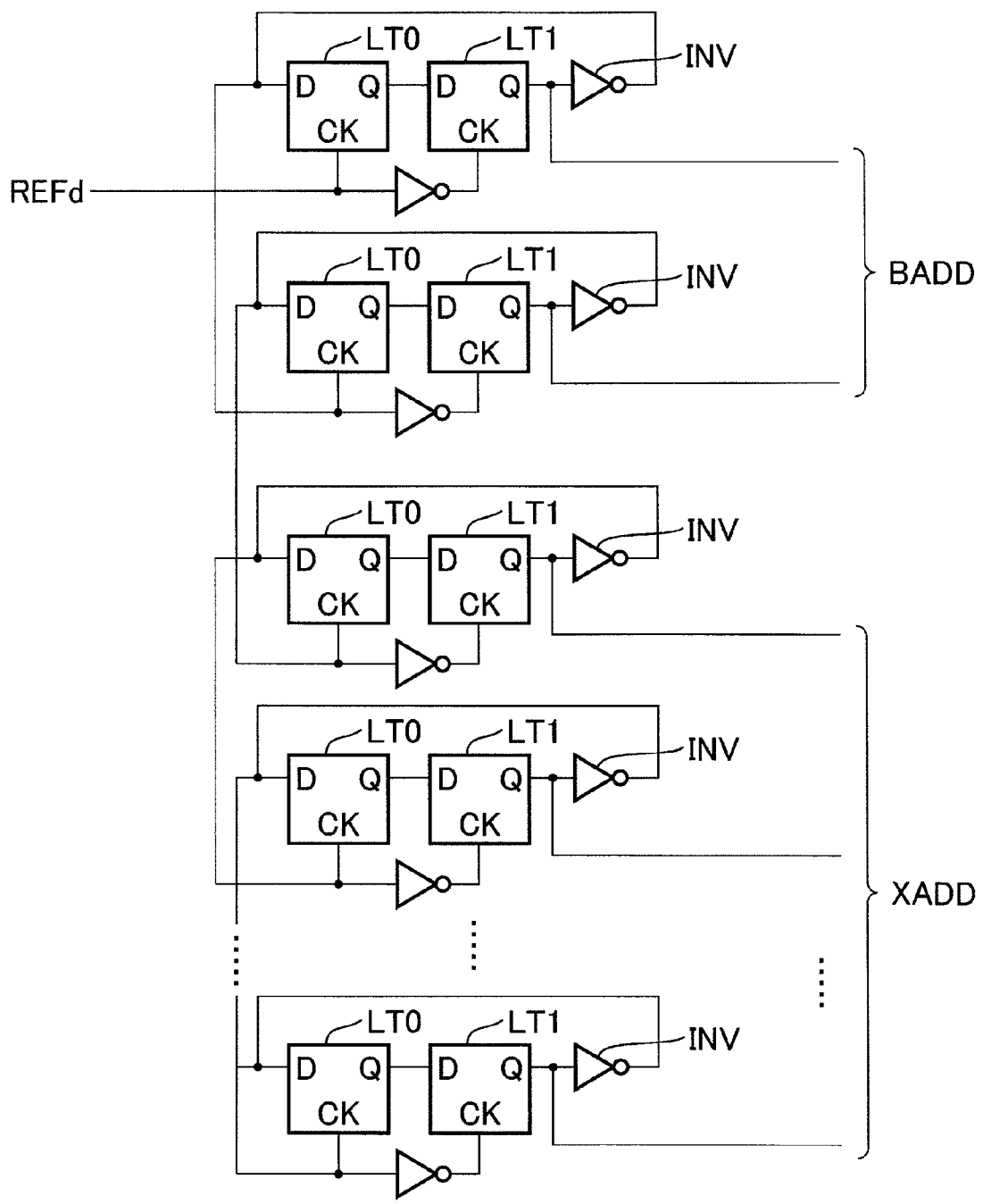
FIG. 16 is a circuit diagram of a refresh counter 61b.

FIG. 16 is a circuit diagram of the refresh counter 61b included in each of the core chips CC0 to CC7.

As shown in FIG. 16, the refresh counter 61b includes plural count bit circuits CB each of which includes two latch circuits LT0 and LT1 that are connected circularly via an inverter INV. An output of each count bit circuit is used as a clock of a next-stage count bit circuit. The refresh control signal REFd is used in a clock of a first-stage count bit circuit. Based on this configuration, the refresh counter 61b functions as a binary counter that counts the refresh control signal REFd. Low-order two bits of the count value are used as a bank address BADD, and other high-order bits are used as a row address XADD.

Figure 17:
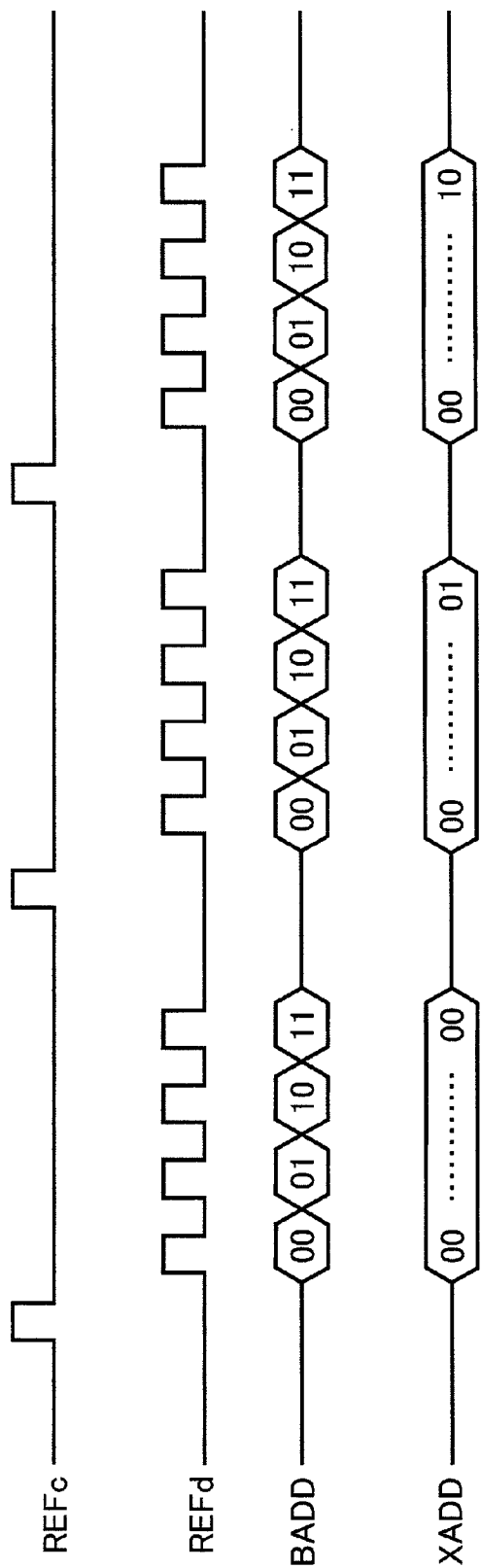
FIG. 17 is a timing diagram for explaining an operation of the refresh counter 61b.

FIG. 17 is a timing diagram for explaining an operation of the refresh counter 61b included in each of the core chips CC0 to CC7.

As shown in FIG. 17, a value of the bank address BADD is incremented each time when the refresh control signal REFd is activated. Accordingly, the bank address BADD makes a circuit corresponding to the activation of the refresh control signal REFd for four times. When the bank address BADD makes the circuit, a row address XADD as a high-order bit of the bank address BADD is incremented. As already explained, the refresh control signal REFd is generated continuously for four times each time when the refresh control signal REFc is activated for one time. Therefore, when the refresh control signal REFc is activated for one time, four bank addresses BADD relevant to one row address XADD are generated. As a result, when the refresh control signal REFc is activated for one time, one row address XADD and four bank addresses BADD relevant to the one row address XADD are given to plural row decoders 51 corresponding to the banks shown in FIG. 4.

Because one core chip includes eight banks 0 to 7, two banks are simultaneously selected corresponding to the refresh control signal REFd for one time by a 2-bit bank address BADD that is output from the refresh counter 61b. Specifically, when the bank address BADD is equal to 00, the bank 0 and the bank 4 are selected. When the bank address BADD is equal to 01, the bank 1 and the bank 5 are selected. When the bank address BADD is equal to 10, the bank 2 and the bank 6 are selected. When the bank address BADD is equal to 11, the bank 3 and the bank 7 are selected. Therefore, the refresh-control-signal dividing circuit 300 performs a refresh operation in the order of the banks 0 and 4, the banks 1 and 5, the banks 2 and 6, the banks 3 and 7 by the refresh control signal REFd for four times generated in chronological order corresponding to the refresh control signal REFc for one time. A simultaneous selection of two banks also includes that the memory cell arrays 50 relevant to the two banks respectively access simultaneously or that operation currents of the memory cell arrays 50 relevant to the two banks respectively are delayed so as to be slightly shifted each other. For example, the simultaneous selection of two banks includes a delaying of slightly shifting the operation currents of the sense circuits 53 relevant to the two banks respectively corresponding to the refresh control signal REFd for one time. These operations are valid to reduce noise within the semiconductor memory device 10.

Figure 18:
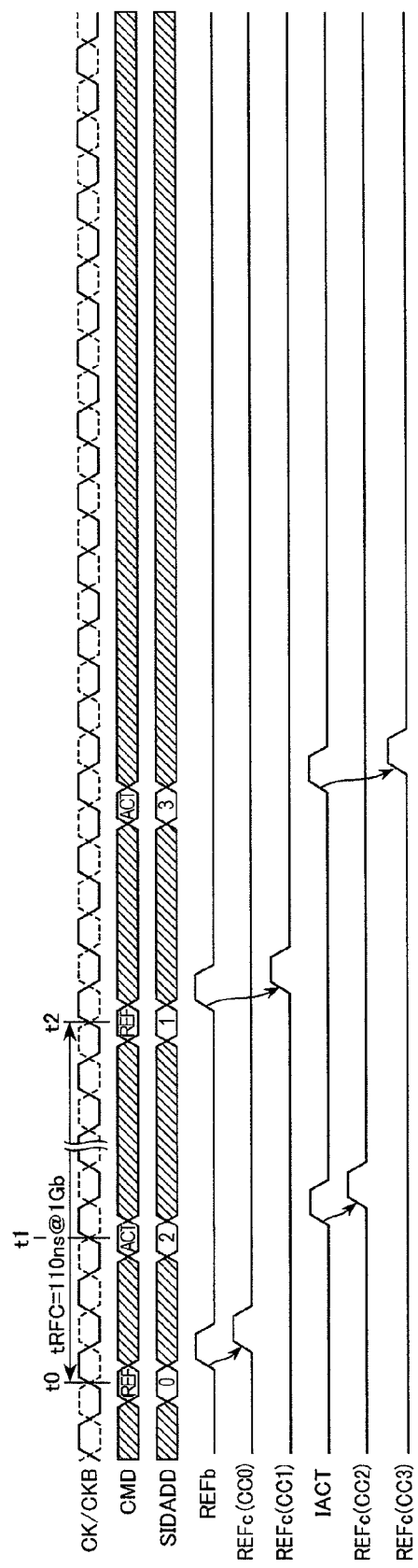
FIG. 18 is a timing diagram for explaining an operation of the semiconductor memory device 10 when the first operation mode is selected.

FIG. 18 is a timing diagram for explaining an operation of the semiconductor memory device 10 when the first operation mode is selected.

In an example shown in FIG. 18, at a time t0, a refresh command REF for one time and the address information SIDADD (first address information) for assigning the core chip CC0 relevant to the refresh command REF for one time are input from outside. In response to the input, the refresh control signal REFb is activated for one time, and this activated signal is supplied to all the core chips CC0 to CC7. However, when the first operation mode is selected, only a core chip assigned by the address information SIDADD becomes valid. Therefore, the refresh control signal REFc is activated for one time in the core chip CC0, and meanwhile, the refresh control signal REFc is not activated in other core chips CC1 to CC7. Consequently, the core chip CC0 is refreshed at an address indicated by the refresh counter 61b included in the core chip CC0 in only the core chip CC0. Banks of the core chip CC0 are refreshed dispersedly in the order of the banks 0 and 4, the banks 1 and 5, the banks 2 and 6, the banks 3 and 7 by the refresh control signal REFd for four times in time series as described above. Therefore, a peak of current consumption can be suppressed.

As described above, in the first operation mode, only a specific core chip can perform a refresh operation in response to the refresh command REF for one time and the address information SIDADD for assigning the core chip CC0 relevant to the refresh command REF for one time that are input from outside. Therefore, other core chips become in an idle state from a viewpoint of outside of the semiconductor memory device. Consequently, in the middle of a refresh operation (refresh access) that is performed by a certain core chip, an access (external access) to a memory cell included in other core chip becomes possible. In the example shown in FIG. 18, at a time t1, an active command ACT for one time and the address information SIDADD (second address information) for assigning the core chip CC2 relevant to the active command ACT for one time are input from outside. Accordingly, an active control signal IACT as a type of the internal command ICMD of the interface IF is activated, and this activated signal is supplied to all the core chips CC0 to CC7. However, because the core chip CC2 is selected by the address information SIDADD, the active control signal IACT becomes valid in only the core chip CC2. The core chip CC2 performs an operation relevant to the active command ACT corresponding to the active control signal IACT.

Further, in the example shown in FIG. 18, at a time t2, the refresh command REF for one time and the address information SIDADD (the first address information) for assigning the core chip CC1 relevant to the refresh command REF for one time are input from outside. At the time t2, the core chip CC2 is in the middle of an access (in the middle of an external access in a non-idle state). However, because the address information SIDADD assigns the core chip CC1 that is different from the core chip CC2, the semiconductor memory device 10 can accept the refresh command REF at the time t2.

At a time t3, the core chip CC2 is in the middle of an access (in the middle of an external access in a non-idle state). However, because the address information SIDADD assigns the core chip CC3 that is different from the core chip CC2, the semiconductor memory device 10 can accept the active command ACT at the time t3.

As described above, when the first operation mode is selected, the semiconductor memory device 10 can perform a refresh operation by selecting a specific core chip. Consequently, in the middle of a refresh operation that is performed by a certain core chip, an access to a memory cell included in other core chip becomes possible. Conversely, in the middle of an access operation that is performed by a certain core chip, a refresh operation can be performed to other core chip. Further, a memory capacity (the number of memory cells) of a chip that is assigned by the refresh command REF for one time is reduced to ⅛ of a conventional memory capacity. Accordingly, the shortest issuing interval of a refresh command can be shortened even when it is necessary to comply with specifications such that a shortest issuing interval of a refresh command becomes long when a memory capacity of the semiconductor memory device 10 is larger. Specifically, while a shortest issuing interval of a refresh command is 110 ns (tRFC=110 ns) when a memory capacity is 1 G in the DDR3 standard, the shortest issuing interval of a refresh command becomes 350 ns (tRFC=350 ns) when the memory capacity is 8 Gb. The semiconductor memory device 10 according to the present embodiment has a total memory capacity of 8 Gb. Therefore, a shortest issuing interval of a refresh command is basically 350 ns. However, because a memory capacity of a chip that is assigned by the refresh command REF for one time is ⅛ of the total memory capacity as described above, the semiconductor memory device 10 can issue a refresh command at an interval of 110 ns that is the same as the interval when a memory capacity is 1 Gb.

FIG. 19 is a timing diagram for explaining an operation of the semiconductor memory device 10 when the second operation mode is selected.

In an example shown in FIG. 19, at a time t10, the refresh command REF is issued for one time from outside. Further, in the second operation mode, the address information SIDADD relevant to issuing of the refresh command for one time is not input. In response to this, the refresh control signal REFb is activated for four times in time series, and the activated signals are supplied to all the core chips CC0 to CC7. However, in each core chip, the refresh control signal REFc is activated only when the signal corresponds to the refresh control signal REFb at a predetermined number of order out of the refresh control signal REFb for four times in time series, by the comparison circuit 220 shown in FIG. 12, as can be understood by an operation waveform of the comparison circuit 220 included in each of the core chips CC0 to CC7 shown in FIG. 14. Therefore, as shown in FIG. 19, the refresh control signal REFc of the comparison circuit 220 included in each of the core chips CC0 to CC7 is activated sequentially in the order of the two core chips CC0 and CC4, the two core chips CC1 and CC5, the two core chips CC2 and CC6, and the two core chips CC3 and CC7. Accordingly, a refresh operation is performed in all the core chips CC0 to CC7.

As described above, in the second operation mode, all the core chips CC0 to CC7 perform a refresh operation corresponding to the refresh command REF for one time from outside. Accordingly, unlike in the first operation mode, during a refresh operation period when all the core chips CC0 to CC7 are busy, a next command cannot be issued to the semiconductor memory device 10 from outside. Similarly, the refresh command REF cannot be issued in the middle of a read operation or a write operation. In the second operation mode, a shortest issuing interval of a refresh command becomes 350 ns when a memory capacity is 8 Gb. That is, a busy period is long unlike in the first operation mode.

In the first operation mode, only one core chip is refreshed corresponding to the refresh command REF for one time. Therefore, as compared with a setting in the second operation mode, an external device that controls the semiconductor memory device 10 needs to issue the refresh command REF at a frequency of eight times. However, it suffices that the external device issues the refresh command REF at a frequency of the number of times of core chips (eight times in the present embodiment) regardless of the number of banks (independent regions) included in one core chip. Therefore, the issuing frequency of the refresh command REF does not become excessively high. As a comparative example, according to a method of assigning one bank of one core chip by the refresh command REF for one time, the external device needs to issue the refresh command REF at a frequency of the number of banks (64 times in the present embodiment) included in a core chip multiplied by the number of core chips. On the other hand, in the present embodiment, the issuing frequency of the refresh command REF does not become excessively high as described above.

Figure 20:
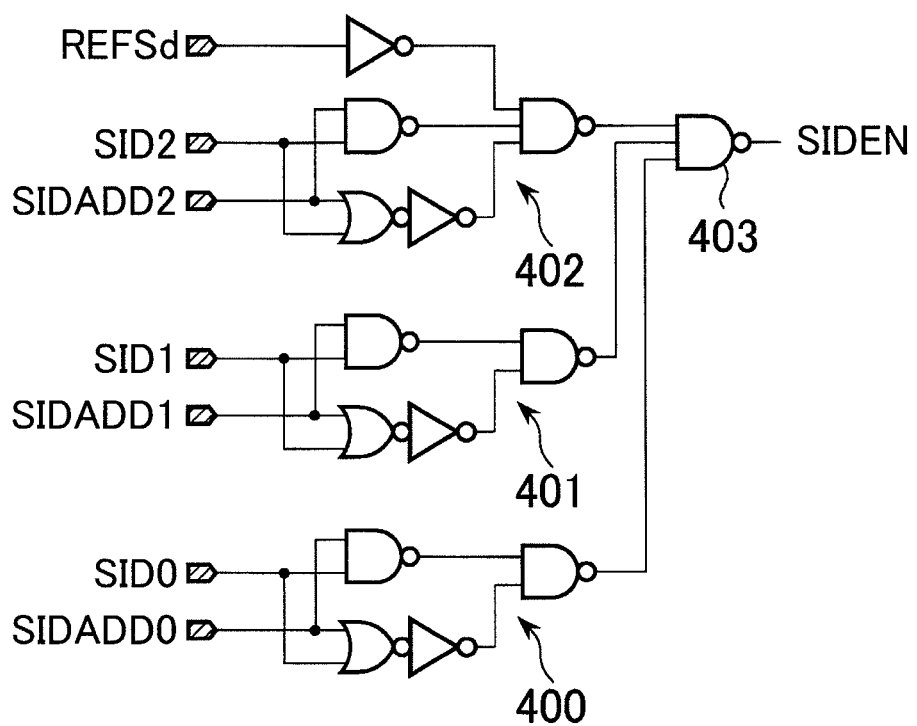
FIG. 20 is a circuit diagram of a layer address comparison circuit 47 according to a modification.

FIG. 20 is a circuit diagram of the layer address comparison circuit 47 included in each of the core chips CC0 to CC7 according to a modification.

The layer address comparison circuit 47 shown in FIG. 20 includes comparing units 400 to 402 that compare bits (SID0 to SID2) of the layer address SID with bits (SIDADD0 to SIDADD2) of the address information SIDADD, respectively, and a NAND gate circuit 403 that receives outputs of the comparing units 400 to 402. An output of the NAND gate circuit 403 is used as the enable signal SIDEN.

A mode selection signal REFSd is input in addition to the layer address SID2 and the address information SIDADD2, to the comparing unit 402. The mode selection signal REFSd is supplied from the mode register 64. When the mode selection signal REFSd is at a low level, a single slice mode is obtained in which only one core chip is refreshed per the refresh command REF for one time in the first operation mode. When the mode selection signal REFSd is at a high level, a double slice mode is obtained in which only two core chips are refreshed per the refresh command REF for one time in the first operation mode.

In the case of the single slice mode, when the bits SID0 to SID2 of the layer address SID and the bits SIDADD0 to SIDADD2 of the address information SIDADD all match each other, the enable signal SIDEN is activated. Therefore, the enable signal SIDEN is activated in only one core chip. On the other hand, in the case of the double slice mode, a comparison operation by the comparing unit 402 is invalidated, and a determination of a match is forcibly made. As a result, the enable signal SIDEN is activated in two core chips. Combinations of two core chips to be activated are fixed, and the core chips CC0 and CC4, the core chips CC1 and CC5, the core chips CC2 and CC6, and the core chips CC3 and CC7 become pairs, respectively.

Figure 21:
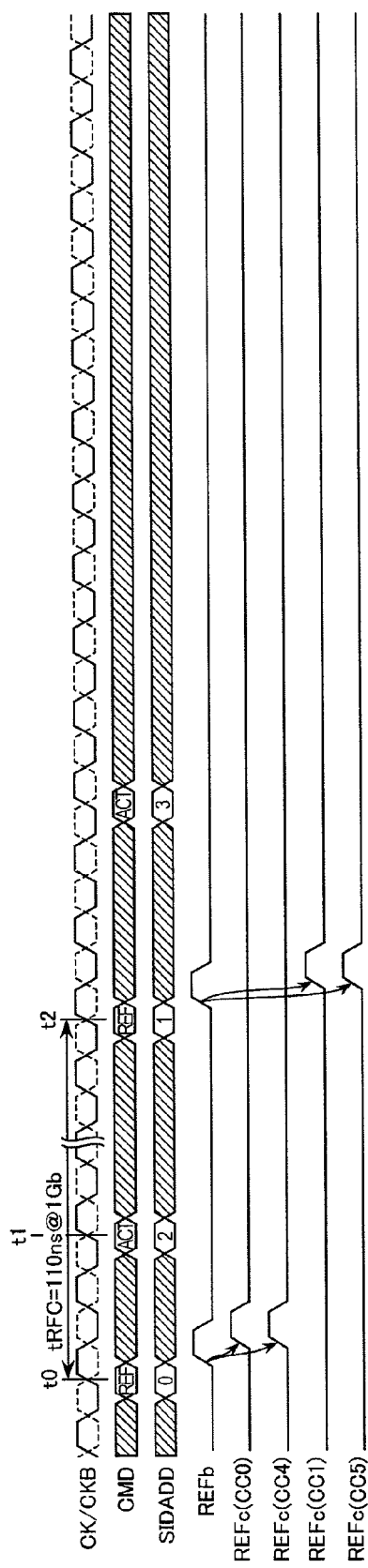
FIG. 21 is a timing diagram for explaining an operation in a double slice mode.

FIG. 21 is a timing diagram for explaining an operation in the double slice mode. The operation in the single slice mode is as explained with reference to FIG. 18.

As shown in FIG. 21, when the refresh command REF and the address information SIDADD for assigning the core chip CC0 are input from outside at the time t0, the refresh control circuit included in each of the core chips CC0 and CC4 activates a corresponding refresh control signal REFc for one time in the core chips CC0 and CC4. Accordingly, a refresh operation is performed simultaneously in the core chips CC0 and CC4. When the refresh command REF and the address information SIDADD for assigning the core chip CC1 are input from outside at the time t2, the refresh control circuit included in each of the core chips CC1 and CC5 activates a corresponding refresh control signal REFc for one time in the core chips CC1 and CC5. Accordingly, a refresh operation is performed in the core chips CC1 and CC5. A simultaneous selection of two core chips also includes that the memory cell arrays 50 relevant to the two core chips respectively access simultaneously or that operation currents of the memory cell arrays 50 relevant to the two core chips respectively are delayed so as to be slightly shifted each other. For example, the simultaneous selection of two core chips includes a delaying of slightly shifting the operation currents of the sense circuits 53 relevant to the two banks respectively corresponding to the refresh control signal REFd for one time. These operations are valid to reduce noise within the semiconductor memory device 10.

As described above, in the double slice mode, because the highest-order bit SIDADD2 of the address information SIDADD is invalidated in a refresh operation, two core chips can be refreshed by the refresh command REF for one time even in the first operation mode. Accordingly, the issuing frequency of the refresh command REF can be set lower. However, in the double slice mode, because two core chips are refreshed simultaneously, six core chips can be accessed out of eight core chips in the refresh operation.

When the number of bits of the address information SIDADD to be invalidated in the refresh operation is increased, the number of core chips to be refreshed by the refresh command REF for one time can be increased. For example, when the address information SIDADD1 and SIDADD2 are invalidated, four core chips can be refreshed by the refresh command REF for one time.

A second embodiment of the present invention is explained next.

Figure 22:
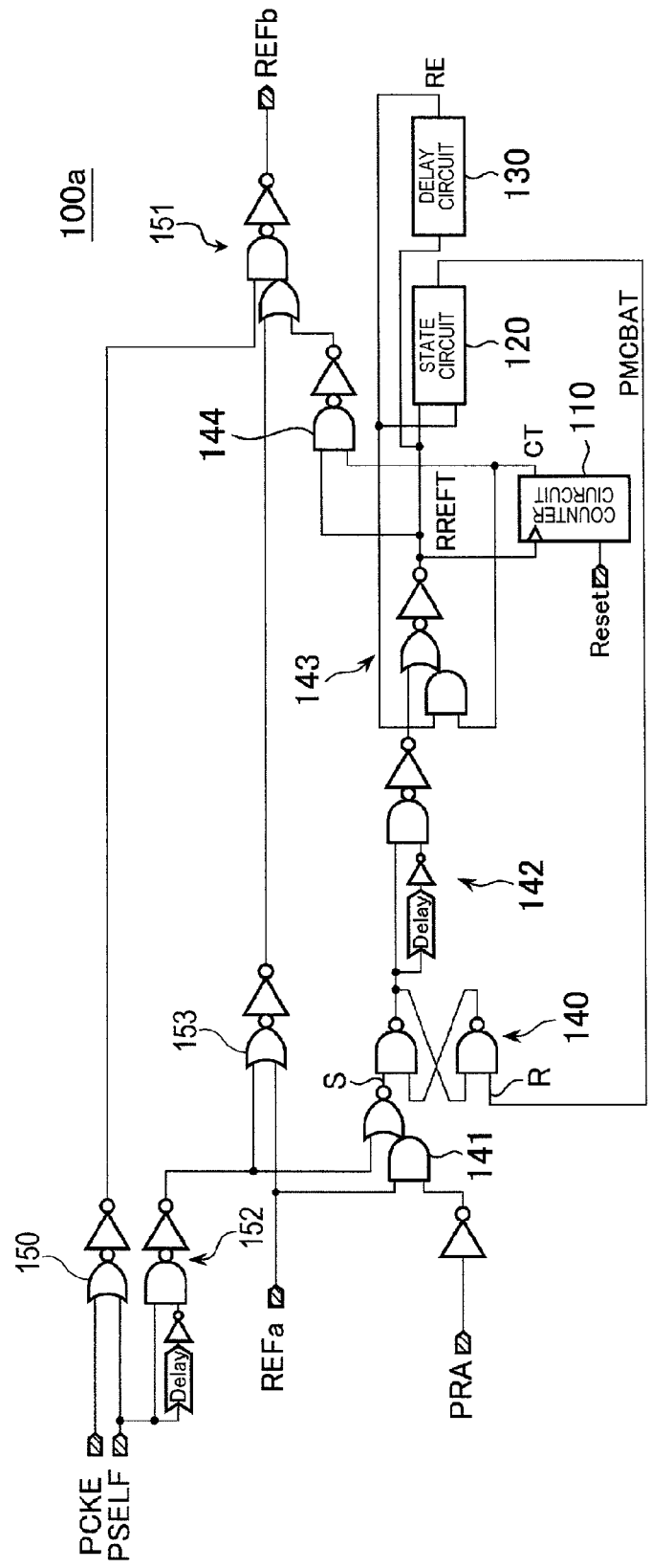
FIG. 22 is a circuit diagram of a refresh-control-signal generation circuit 100a used in a second embodiment.

FIG. 22 is a circuit diagram of a refresh-control-signal generation circuit 100a included in the interface chip IF that is used in a second embodiment of the present invention. The refresh-control-signal generation circuit 100a is used instead of the refresh-control-signal generation circuit 100 shown in FIG. 7.

As shown in FIG. 22, a self-refresh state signal PSELF and a clock enable signal POKE are used in the refresh-control-signal generation circuit 100a. The self-refresh state signal PSELF becomes at a high level when a self-refresh entry command is issued from outside, and this signal shows a state that the semiconductor memory device 10 is in a self-refresh mode. The clock enable signal PCKE is an internal command and the clock enable signal CKE supplied from outside is buffered. When the self-refresh entry command is issued, the clock enable signal CKE immediately becomes at a low level.

The self-refresh state signal PSELF and the clock enable signal CKE are input to an OR gate circuit 150, and an output of the OR gate circuit 150 is input to a complex gate circuit 151. The complex gate circuit 151 corresponds to the OR gate circuit 145 shown in FIG. 7, and an output of the complex gate circuit 151 is used as the refresh control signal REFb. As described above, because the clock enable signal CKE becomes a low level when a self-refresh entry command is input, activation of the refresh control signal REFb is prohibited until the self-refresh state signal PSELF changes to a high level. Therefore, activation of the internal refresh command REFa at a first time is invalidated. When the self-refresh state signal PSELF changes to a high level to compensate for the invalidation, a one-shot-pulse generation circuit 152 generates a one-shot signal, and activates the refresh control signal REFb via an OR gate circuit 153. At the same time, the SR latch circuit 140 is set, and an operation similar to that of the second operation mode is started regardless of the mode selection signal PRA. That is, the refresh-control-signal generation circuit 100a generates the refresh control signal REFb for four times each time when the internal refresh command REFa is activated.

Thereafter, the refresh control signal REFb is activated for four times each time when the internal refresh command REFa is activated, the internal refresh command REFa being periodically and automatically generated asynchronously with outside of the semiconductor memory device 10 by a refresh timer (not shown) that is included in the interface chip IF.

Figure 23:
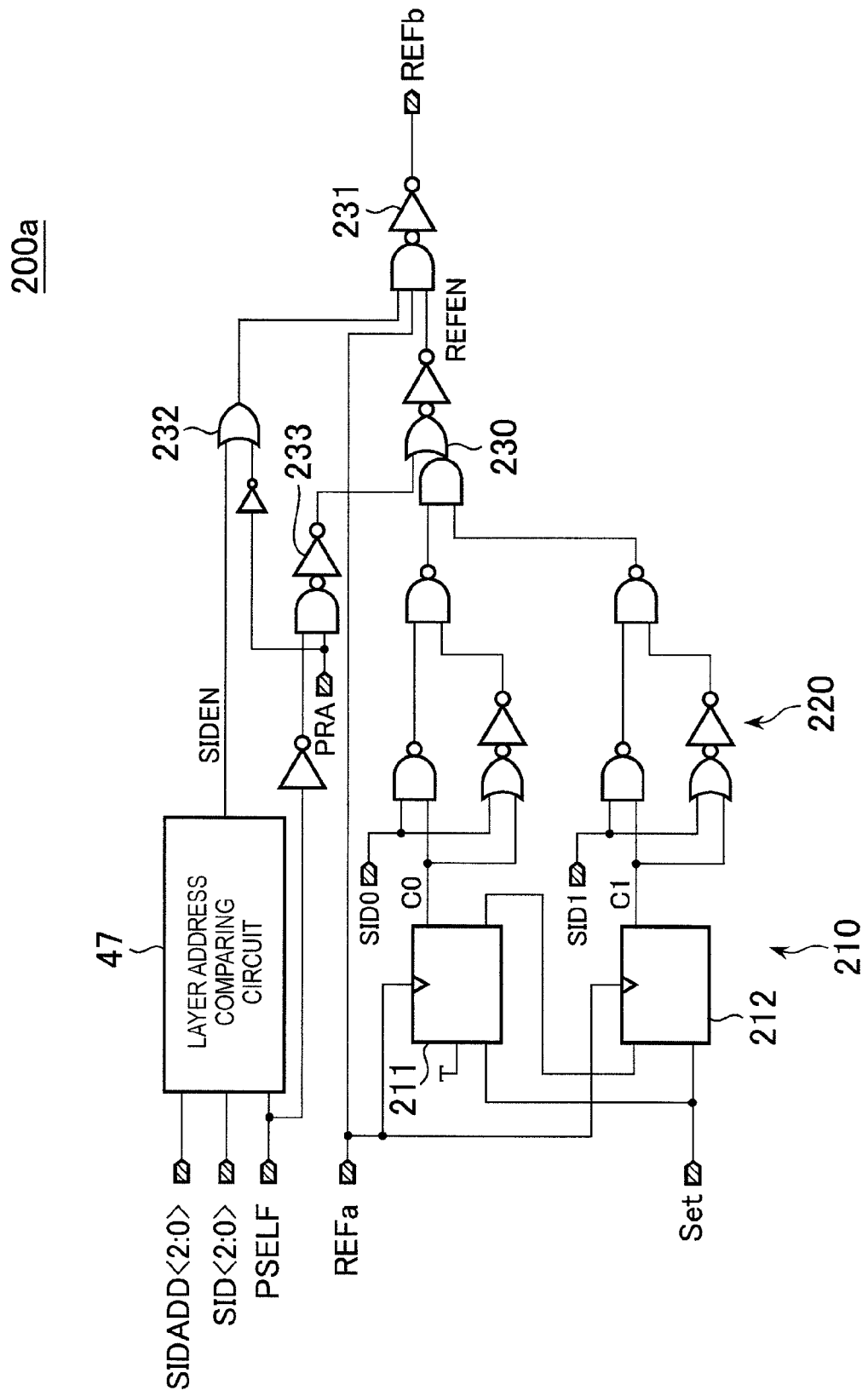
FIG. 23 is a circuit diagram of a refresh-control-signal generation circuit 200a used in the second embodiment.

FIG. 23 is a circuit diagram of the refresh control circuit 200a included in each of the core chips CC0 to CC7 that is used in the second embodiment. The refresh control circuit 200a is used instead of the refresh control circuit 200 shown in FIG. 12.

As shown in FIG. 23, in the refresh control circuit 200a, an inversion signal of the self-refresh state signal PSELF is supplied to an AND gate circuit 233. Therefore, the enable signal REFEN as an output of the complex gate circuit 230 is normally activated only when the mode selection signal PRA is equal to H and when the self-refresh state signal PSELF is equal to L. That is, even in the first operation mode, normal activation of the enable signal REFEN is cancelled when the semiconductor memory device 10 enters the self-refresh mode. The enable signal REFEN is activated only when the comparison circuit 220 detects a match. The self-refresh state signal PSELF is also supplied to the layer address comparison circuit 47.

Figure 24:
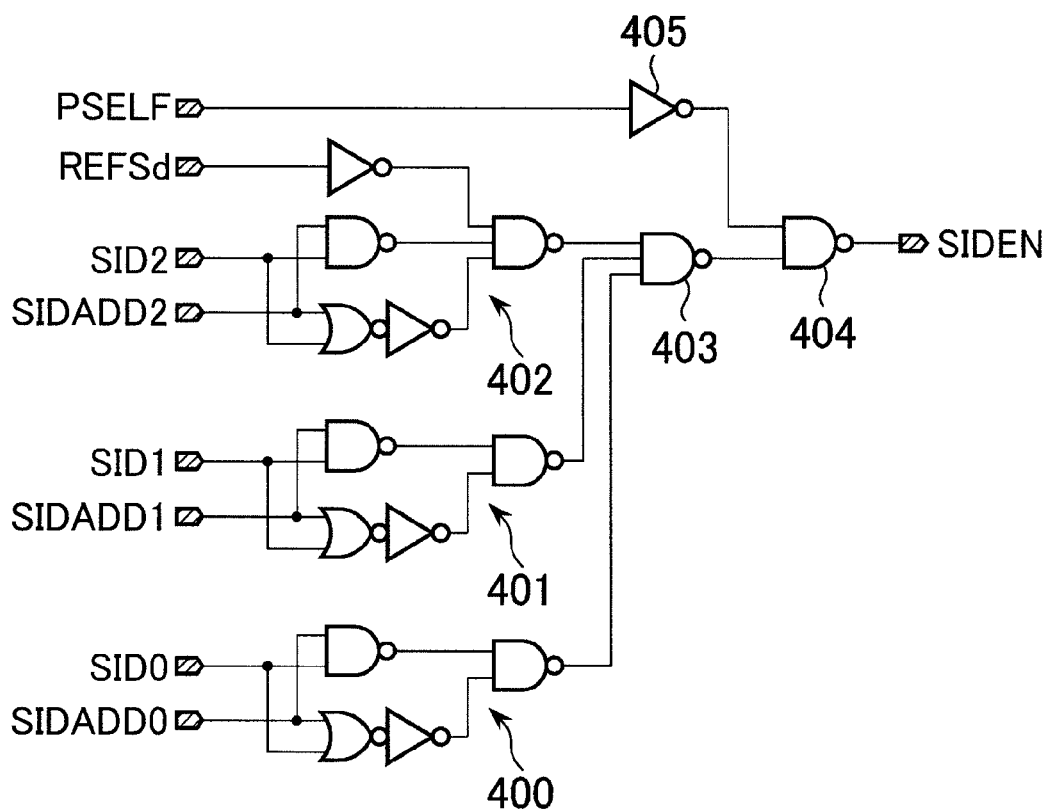
FIG. 24 is a circuit diagram of a layer address comparison circuit 47a used in the second embodiment.

FIG. 24 is a circuit diagram of a layer address comparison circuit 47a included in each of the core chips CC0 to CC7 and that is used in the second embodiment. The layer address comparison circuit 47a is used instead of the layer address comparison circuit 47 shown in FIG. 20.

The layer address comparison circuit 47a shown in FIG. 24 includes an inverter 405 that inverts the self-refresh state signal PSELF, and a NAND gate circuit 404 that receives an output of the inverter 405 and an output of the NAND gate circuit 403, in addition to the layer address comparison circuit 47 shown in FIG. 20. An output of the NAND gate circuit 404 is used as the enable signal SIDEN. Based on a configuration described above, the enable signal SIDEN is forcibly set at a high level when the self-refresh state signal PSELF is at a high level.

As explained above, according to the second embodiment, even when the first operation mode is selected, the semiconductor memory device 10 performs a refresh operation similar to that in the second operation mode when the semiconductor memory device 10 enters the self-refresh mode. Therefore, all the core chips CC0 to CC7 can be refreshed without generating the address information SIDADD within the semiconductor memory device 10.

Figure 25:
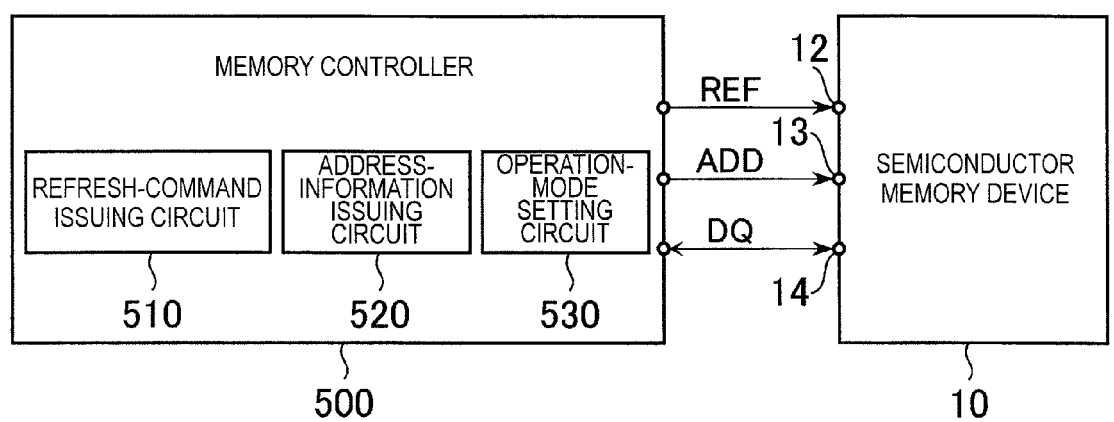
FIG. 25 is a diagram showing a configuration of a data processing system that uses the semiconductor memory device 10.

FIG. 25 shows a configuration of a data processing system that uses the semiconductor memory device 10 according to the embodiment.

The data processing system shown in FIG. 25 is constituted by the semiconductor memory device 10 and a memory controller 500 that is connected to the semiconductor memory device 10. The memory controller 500 includes a refresh-command issuing circuit (first circuit) 510 that issues a refresh command for plural times during a predetermined period, and periodically issues the refresh command REF to the semiconductor memory device 10. The memory controller 500 also includes an address-information issuing circuit 520 that issues the address information SIDADD. When the semiconductor memory device 10 is in the first operation mode, the address-information issuing circuit 520 issues the address information SIDADD each time when the refresh-command issuing circuit 510 issues a refresh command. On the other hand, the memory controller 500 does not issue a bank address when the refresh command REF is issued. This is because a bank address relevant to a refresh operation is automatically generated by the refresh counter 61b within the core chips CC0 to CC7. Whether the semiconductor memory device 10 is to be set in the first operation mode or the second operation mode is set by an operation-mode setting circuit (third circuit) 530 included in the memory controller 500.

As already explained above, when the semiconductor memory device 10 is set in the first operation mode, one or two or more core chips that are assigned by the address information SIDADD are selectively refreshed. Therefore, the number of times that the refresh command REF is issued by the refresh-command issuing circuit 510 during a predetermined period is greater when the semiconductor memory device 10 is set in the first operation mode than when the semiconductor memory device 10 is set in the second operation mode.

Specifically, when the semiconductor memory device 10 is set in the first operation mode and also when only one core chip is refreshed in response to the refresh command REF for one time (see FIG. 18), the refresh command REF needs to be issued at a frequency of eight times ($=2^3$) of a case when the semiconductor memory device 10 is set in the second operation mode. When the semiconductor memory device 10 is set in the first operation mode and also when only two core chips are refreshed in response to the refresh command REF for one time (see FIG. 21), the refresh command REF needs to be issued at a frequency of four times ($=2^2$) of a case when the semiconductor memory device 10 is set in the second operation mode. As described above, the number of times when the refresh-command issuing circuit 510 needs to issue the refresh command REF during a predetermined period when the semiconductor memory device 10 is set in the first operation mode becomes a power of two of the number of times when the refresh-command issuing circuit 510 needs to issue the refresh command REF during a predetermined period when the semiconductor memory device 10 is set in the second operation mode.

In a normal access, the memory controller 500 supplies a read command or a write command to the command terminal 12 of the semiconductor memory device 10, and supplies the address signal ADD to the address terminal 13. Accordingly, read data DQ is supplied to the memory controller 500 from the data input/output terminal 14 of the semiconductor memory device 10 in a read operation, and the memory controller 500 supplies write data DQ to the data input/output terminal 14 of the semiconductor memory device 10 in a write operation.

It is apparent that the present invention is not limited to the above embodiments, but may be modified and changed without departing from the scope and spirit of the invention.

For example, although a DDR3 SDRAM is used as a core chip in the embodiments described above, the SDRAM used in the present invention is not limited thereto. Therefore, it suffices to use a DRAM other than a DDR3 SDRAM, and a semiconductor memory other than a DRAM is also acceptable as far as the semiconductor memory is of a type that requires a refresh operation. It is not essential that all core chips are stacked, and a part or the whole of core chips can be arranged in a plane. Further, the number of core chips is not limited to eight.

In the embodiments described above, although the mode selection signal PRA to be used in each of the core chips CC0 to CC7 is supplied from the mode register 64 within a corresponding core chip, the mode selection signal PRA can be supplied to each of the core chips CC0 to CC7 from the mode register 42 within an interface chip. Further, the mode selection signal PRA does not need to be switchable by the memory controller 500, and a manufacturer of a semiconductor memory device can fix an operation mode at a manufacturing stage of the semiconductor memory device by using a ROM or the like.

In the embodiments described above, although the refresh-control-signal dividing circuit 300 included in each of the core chips CC0 to CC7 is used to refresh eight banks for four times separately in response to activation of the refresh control signal REFc that is generated by each of the core chips CC0 to CC7, a refresh method of the eight banks is not particularly limited. The eight banks can be refreshed for eight times separately for each one bank, or can be refreshed for two times separately for each four banks, or the eight banks can be refreshed simultaneously.

In the embodiments described above, when the semiconductor memory device 10 is set in the second operation mode, the refresh control signal REFb generated by the interface chip IF is activated for four times in response to the internal refresh command REFa for one time generated by the interface chip IF. However, so long as all the core chips CC0 to CC7 are refreshed, there is no particular limit to the number of times when the refresh control signal REFb generated by the interface chip IF is activated. Specifically, when the number of core chips is m, in the second operation mode, it suffices that the refresh-control-signal generation circuit 100 included in the interface chip IF activates the refresh control signal REFb at $m/2^n$ times (n is an integer equal to or larger than 0) in response to the internal refresh command REFa. With this arrangement, all the core chips CC0 to CC7 can be refreshed simultaneously.

In addition, while not specifically claimed in the claim section, the applicant reserves the right to include in the claim section of the application at any appropriate time the following devices:

A1. A memory controller that controls a semiconductor memory device including an interface chip and a plurality of core chips, the memory controller comprising:
a first circuit that issues a refresh command at a plurality of times during a predetermined period; and
a second circuit that issues address information that selects the core chips along with the refresh command.

A2. The memory controller as A1, further comprising
a plurality of memory cells provided in each of the core chips are classified into a plurality of independent regions that are mutually non-exclusively controlled, wherein
the memory controller does not issue a bank address that selects one of the independent regions along with the refresh command.

A3. The memory controller as A1, further comprising a third circuit that sets the semiconductor memory device in one of a first operation mode and a second operation mode, wherein
a number of times in which the first circuit issues the refresh command during the predetermined period on the semiconductor memory device is set in the first operation mode is greater than a number of times in which the first circuit issues the refresh command during the predetermined period on the semiconductor memory device is set in the second operation mode.

A4. The memory controller as A3, wherein the number of times in which the first circuit issues the refresh command during the predetermined period on the semiconductor memory device is set in the first operation mode is a power of two of the number of times in which the first circuit issues the refresh command during the predetermined period on the semiconductor memory device is set in the second operation mode.

A5. The memory controller as A3, wherein on the semiconductor memory device is set in the second operation mode, the memory controller does not supply the address information that selects the core chip along with the refresh command.

A6. The memory controller as A2, further comprising a third circuit that sets the semiconductor memory device in one of a first operation mode and a second operation mode, wherein
a number of times in which the first circuit issues the refresh command during the predetermined period on the semiconductor memory device is set in the first operation mode is greater than a number of times in which the first circuit issues the refresh command during the predetermined period on the semiconductor memory device is set in the second operation mode.

A7. The memory controller as A6, wherein the number of times in which the first circuit issues the refresh command during the predetermined period on the semiconductor memory device is set in the first operation mode is a power of two of the number of times in which the first circuit issues the refresh command during the predetermined period on the semiconductor memory device is set in the second operation mode.

A8. The memory controller as A6, wherein when the semiconductor memory device is set in the second operation mode, the memory controller does not supply the address information that selects the core chip along with the refresh command.

What is claimed is:

1. A semiconductor memory device comprising:
a plurality of core chips assigned to mutually different chip information, each of the core chips comprising a plurality of memory cells that require a refresh operation to hold data stored therein; and
an interface chip that receives a refresh command and a first address information supplied from the outside, the first address information relating to the chip information, the interface chip generates at least onetime of a refresh control signal based on the refresh command, and supplies the refresh control signal and the first address information in common to the core chips, wherein
each of the core chips includes:
a determining circuit that determines whether the first address information supplied from the interface chip selects a respective core chip; and
a refresh control circuit that performs the refresh operation to the memory cell included in the respective core chip in response to the refresh control signal when the determining circuit determines that the first address information selects the respective core chip.

2. The semiconductor memory device as claimed in claim 1, wherein
the memory cells provided in each of the core chips are classified into a plurality of independent regions that are mutually nonexclusively controlled, and the independent regions each belongs to different core chips constitute a memory bank, thereby the core chips comprises a plurality of the memory banks.

3. The semiconductor memory device as claimed in claim 2, wherein at least one of the core chips selected by the determining circuit performs the refresh operation to the independent regions each time when the refresh control signal is activated.

4. The semiconductor memory device as claimed in claim 2, wherein each of the core chips includes a refresh counter that generates an address of a memory cell to be refreshed when the core chip is selected by the determining circuit.

5. The semiconductor memory device as claimed in claim 4, wherein
the refresh counter included in the selected core chip generates a plurality of bank addresses that selects the independent regions each time when the refresh control signal is activated, and
the refresh control circuit included in the selected core chip performs the refresh operation to the independent regions selected by the bank addresses respectively.

6. The semiconductor memory device as claimed in claim 1, wherein the determining circuit determines whether the first address information selects the respective core chip by comparing at least a part of the chip information with at least a part of the first address information.

7. The semiconductor memory device as claimed in claim 1, wherein
the semiconductor memory device has a first operation mode and a second operation mode,
the interface chip includes a refresh-control-signal generation circuit that generates the refresh control signal based on the refresh command, and
the refresh-control-signal generation circuit generates the refresh control signal for one time each time when the refresh command is issued in the first operation mode, and generates the refresh control signals at a plurality of times each time when the refresh command is issued in the second operation mode.

8. The semiconductor memory device as claimed in claim 7, wherein
the refresh control circuit, in the first operation mode, performs the refresh operation to the memory cell each time the refresh control signal is supplied from the interface chip to the core chip selected by the determining circuit, and
the refresh control circuit, in the second operation mode, performs the refresh operation to the memory cell each time the refresh control signals are supplied from the interface chip at a predetermined number of times regardless of whether the core chip is selected by the determining circuit.

9. The semiconductor memory device as claimed in claim 8, wherein the refresh control circuits included in each of the core chips, in the second operation mode, performs the refresh operation to the memory cell corresponding to mutually different numbers of order out of the predetermined number of times.

10. The semiconductor memory device as claimed in claim 7, wherein at least one of the interface chip and the core chips includes a mode register that selects one of the first operation mode and the second operation mode.

11. The semiconductor memory device as claimed in claim 7, wherein the refresh-control-signal generation circuit activates the refresh control signal at $m/2^n$ times each time when the refresh command is issued where m indicates number of the core chips and n is an integer equal to or larger than 0.

12. The semiconductor memory device as claimed in claim 7, the interface chip enters a self-refresh mode in response to a self-refresh entry command that is supplied from the outside, and periodically generates the refresh control signal.

13. The semiconductor memory device as claimed in claim 12, wherein in the self-refresh mode, even when any one of the first and second operation modes is selected, the refresh control circuit performs the refresh operation to the memory cell each time when the refresh control signals are supplied from the interface chip at a predetermined number of times regardless of whether the core chip is selected by the determining circuit.

14. The semiconductor memory device as claimed in claim 1, wherein the interface chip latches the first address information that is supplied from the outside based on the refresh command and determines the latched first address information as a third address information, and supplies the determined third address information in common to the core chips as the first address information.

15. The semiconductor memory device as claimed in claim 1, wherein the refresh command is an auto-refresh command.

16. The semiconductor memory device as claimed in claim 1, wherein the core chips are stacked with each other, and the refresh control signal and the first address information are supplied in common to the core chips from the interface chip via a plurality of through-electrodes that penetrate the core chips respectively and are mutually electrically common.

17. The semiconductor memory device as claimed in claim 16, wherein
the core chips and the interface chip are stacked, and
the interface chip includes a plurality of external terminals to which the refresh command and the first address information are respectively supplied from the outside.

18. The semiconductor memory device as claimed in claim 1, wherein
the interface chip includes a frontend function that communicates with the outside at a first operation frequency, and
each of the core chips includes a backend function that communicates with the interface chip at a second operation frequency that is lower than the first operation frequency.

19. The semiconductor memory device as claimed in claim 1, wherein
the interface chip supplies an active control signal and a second address information to the core chips in common in response to an active command and the second address information that are supplied from the outside while a first core chip out of the core chips performs the refresh operation, the second address information relates to the chip information and selects a second core chip out of the core chips, the refresh operation is based on the first address information that selects the first core chip and the refresh command that are supplied from the outside, and
the semiconductor memory device performs a read operation or a write operation that communicates with the outside between the second core chip while the first core chip performs the refresh operation.

20. The semiconductor memory device as claimed in claim 19, wherein the interface chip supplies the second address information in common to the core chips via a signal path that is the same as the signal path of the first address information.

21. The semiconductor memory device as claimed in claim 19, wherein
the interface chip supplies the refresh control signal and the first address information that selects the second core chip, to the core chips in common in response to the refresh command and the first address information that are supplied from the outside while accessing the first core chip based on the active command and the second address information that selects the first core chip that is to perform an active operation based on the active command, thereby the second core chip performs the refresh operation while the first core chip performs the read operation or the write operation.

22. A memory system comprising:
a semiconductor memory device comprising a plurality of core chips and an interface chip that controls the core chips, each of the core chips including a plurality of memory cells and a refresh control circuit that performs a refresh operation to the memory cells; and
a memory controller that controls the semiconductor memory device, wherein
the memory controller includes:
a first circuit that issues a refresh command at a plurality of times during a predetermined period; and
a second circuit that issues an address information that selects the core chips along with the refresh command,
the interface chip includes a refresh-control-signal generation circuit that receives the refresh command and the address information that are supplied from the memory controller and generates a refresh control signal in response to the refresh command,
the interface chip supplies the refresh control signal and the address information in common to the core chips,
each of the core chips includes a determining circuit that determines whether the address information selects a respective core chip, and
the refresh control circuit performs the refresh operation to the memory cell in response to the refresh control signal when the address information selects the respective core chip.

23. The memory system as claimed in claim 22, wherein
the memory cells that are provided in each of the core chips are classified into a plurality of independent regions that are mutually nonexclusively controlled, and
the memory controller does not issue a bank address that selects one of the independent regions along with the refresh command.

24. The memory system as claimed in claim 22, wherein
the semiconductor memory device has a first operation mode and a second operation mode, and
the refresh-control-signal generation circuit generates the refresh control signal for one time each time when the refresh command is issued in the first operation mode, and generates the refresh control signals at a plurality of times each time when the refresh command is issued in the second operation mode.

25. The memory system as claimed in claim 24, wherein
the refresh control circuit, in the first operation mode, performs the refresh operation to the memory cell each time the refresh control signal is supplied from the interface chip to the respective core chip selected by the determining circuit, and
the refresh control circuit, in the second operation mode, performs the refresh operation to the memory cell each time the refresh control signals are supplied from the interface chip at a predetermined number of times regardless of whether the respective core chip is selected by the determining circuit.

26. The memory system as claimed in claim 24, wherein
the memory controller further includes a third circuit that sets the semiconductor memory device in one of the first operation mode and the second operation mode, and
a number of times in which the first circuit issues the refresh command during the predetermined period to the semiconductor memory device in the first operation mode is smaller than a number of times in which the first circuit issues the refresh command during the predetermined period to the semiconductor memory device in the second operation mode.

27. The memory system as claimed in claim 26, wherein when the semiconductor memory device is set in the second operation mode, the memory controller does not supply the address information that selects the core chip along with the refresh command.

28. The memory system as claimed in claim 22, wherein the core chips are stacked with each other, and the refresh control signal and the address information are supplied in common to the core chips from the interface chip via a plurality of through-electrodes that penetrate the core chips respectively and are mutually electrically common.

* * * * *